United States Patent
Aoyagi et al.

[11] Patent Number: 5,906,753
[45] Date of Patent: May 25, 1999

[54] METHOD OF MAKING OPTICAL SEMI-CONDUCTOR DEVICE

[75] Inventors: Toshitaka Aoyagi; Yasunori Miyazaki, both of Tokyo, Japan

[73] Assignee: Mitsubishi Denki Kabushiki Kaisha, Tokyo, Japan

[21] Appl. No.: 08/961,145

[22] Filed: Oct. 30, 1997

Related U.S. Application Data

[62] Division of application No. 08/695,915, Aug. 12, 1996, Pat. No. 5,790,737.

[30] Foreign Application Priority Data

Nov. 21, 1995 [JP] Japan ................................. 7-303064

[51] Int. Cl.⁶ ....................................................... B44C 1/22
[52] U.S. Cl. ................................... 216/24; 216/2; 216/59; 216/84; 216/52; 438/690
[58] Field of Search ................................... 216/2, 24, 52, 216/59, 60, 84, 85; 438/14, 16, 690

[56] References Cited

U.S. PATENT DOCUMENTS

| | | | |
|---|---|---|---|
| 4,317,699 | 3/1982 | Winzer et al. | 216/24 |
| 4,598,039 | 7/1986 | Fischer et al. | 216/24 X |
| 5,375,182 | 12/1994 | Chambers et al. | 385/49 |
| 5,459,081 | 10/1995 | Kajita | 437/3 |

FOREIGN PATENT DOCUMENTS

| | | |
|---|---|---|
| 0703616 | 3/1996 | European Pat. Off. |
| 6160656 | 6/1994 | Japan |
| 743565 | 2/1995 | Japan |

*Primary Examiner*—William Powell
*Attorney, Agent, or Firm*—Leydig, Voit & Mayer

[57] ABSTRACT

A method of manufacturing an optical semiconductor device including forming an optical waveguide on a substrate and forming an alignment mark on the substrate simultaneously with the optical waveguide. The alignment marks do not transmit infrared light and, when the substrate is mounted on an infrared transmissive submount, precise alignment can be achieved by observing transmitted light. Thus, the optical semiconductor device including the substrate is soldered at the desired location.

9 Claims, 27 Drawing Sheets

METHOD OF MAKING OPTICAL SEMICONDUCTOR DEVICE

This disclosure is a division of patent application Ser. No. 08/695,915, filed on Aug. 12, 1996, now U.S. Pat. No 5,790,737.

BACKGROUND OF THE INVENTION

1. Field of the Invention

The present invention relates to the devices semiconductor devices, such as a semiconductor laser chip, an endface incident type photodiode, or an endface incident-type semiconductor amplifier, which may be incorporated with high precision into an optical communication module, and methods of manufacturing the devices.

2. Description of the Related Art

Among the methods for incorporating a semiconductor laser chip into an optical communication module are an "active alignment method" and a "passive alignment method". In the active alignment method, the optical axis of a semiconductor laser chip, while emitting light, is aligned with an optical fiber, the semiconductor laser chip being fixed to a submount at a position where an optical output may be obtained.

In the passive alignment method, on the other hand, the semiconductor laser chip is positioned such that an alignment mark on the semiconductor laser chip is superimposed on an alignment mark on the submount, and the semiconductor laser chip is then fixed to a submount.

Since alignment of optical axes generally takes a long time, the passive alignment method not requiring alignment of optical axes results in a better throughput and allows the fabrication of an optical communication module at a lower cost as compared to the active alignment method where alignment of optical axes is required.

In the passive alignment method, however, the precision of the position of the alignment mark on the semiconductor laser chip with respect to a waveguide (emitting point) has a large effect on the coupling efficiency of an exiting laser beam to an optical fiber. Accordingly, an optical communication module having an excellent coupling efficiency cannot be achieved without improving the alignment mark positioning precision.

A known optical semiconductor device and passive alignment method are described with reference to FIGS. 26A to 27C. FIG. 26A is a plan view of a known semiconductor laser chip. FIG. 26B is a cross-sectional view of the known semiconductor laser chip taken along line 26B—26B of FIG. 26A. FIGS. 27A to 27C show a passive alignment method using a known semiconductor laser chip. The structures of FIGS. 26A to 27C are not known to the public but represent a created technology for explaining the invention.

Referring to FIGS. 26A and 26B, a known semiconductor laser chip 1 includes a substrate 2, an active layer 3 (optical waveguide 3a), a current blocking layer 6, a contact layer 7, an insulating film 8, a front surface electrode 9, a pair of alignment marks 10 formed at the same time as the front surface electrode 9, and a back surface electrode 11. The alignment marks 10 are the same material as the front surface electrode 9.

Referring to FIGS. 27A to 27C, a submount 20 includes a substrate 21, an optical fiber 22 on the substrate 21, a metal pattern 24 on the substrate 21 and having a pair of alignment marks 23, and a solder 25 on the metal pattern 24. The pair of alignment marks 23 are holes in the metal pattern 24 at symmetrical positions with respect to the center line of the optical fiber 22.

The known passive alignment method is now described. The semiconductor laser chip 1 of FIG. 27A, while being aligned by means of infrared light, is die bonded, as shown in FIG. 27C, to the submount 20 of FIG. 27B. As a coarse alignment step, the semiconductor laser chip 1 is placed on the submount 20, for example, with a vacuum tweezer. The coarse alignment uses pattern recognition with the metal pattern 24 indicating the mounting position of the semiconductor laser chip 1 on the submount 20, and infrared light transmitted through the front surface electrode 9 or back surface electrode 11 of the semiconductor laser chip 1. For example, infrared light incident on and transmitted through the semiconductor laser chip 1 is detected by a CCD (charge coupled device) disposed at the back surface of the submount 20.

The alignment mark 10 of the semiconductor laser chip 1, which does not transmit infrared light, and the alignment mark 23 on the submount 20, which transmits infrared light, are seen as overlapping, as shown in FIG. 27C, when infrared light is transmitted. Alignment is effected during transmission of the infrared light so that the respective centers of areas of the alignment marks 10 and 23 coincide. The metal pattern 24 and the back surface electrode 11 are then bonded to each other using the solder 25. Thereafter, an optical communication module is fabricated by mounting on the submount 20 an electrode for driving the semiconductor laser chip 1, a photodiode for monitoring an output laser beam, etc.

In the known semiconductor laser chip, the optical waveguide 3a and the alignment mark 10 are formed in different processes, i.e., the alignment mark 10 is formed together with the front surface electrode 9 in a processing step that is later than the processing step for forming the active layer 3. There has thus been a problem, reflecting a limit of precision in superposition of a mask aligner, that an offset B as shown in FIG. 26A necessarily occurs between the center line of the optical waveguide 3a and the center line (bisector) of the pair of alignment marks 10.

Further, since this offset B is usually on the order of several microns, it is very difficult to achieve a precision on the order of submicrons, as required, using the passive alignment method. If, as shown in FIG. 27C, the semiconductor laser chip 1 with the offset B is used, the coupling efficiency between the optical waveguide 3a and the optical fiber 22 is poor. It has thus been difficult to obtain an optical communication module having an excellent coupling efficiency at a high yield.

SUMMARY OF THE INVENTION

It is an object of the present invention to provide an optical semiconductor device and a method of manufacturing the device in which the precision of alignment mark position with respect to an optical waveguide is improved and, as a result, an optical communication module having an excellent coupling efficiency is obtained at a high yield.

An optical semiconductor device according to the present invention comprises a substrate, an optical waveguide on the substrate, and an alignment mark in the substrate together with the optical waveguide.

An optical semiconductor device according to the present invention comprises a conductive layer on the substrate, an insulating film on the conductive layer, a front surface electrode on the insulating film, and a back surface electrode on a back surface of the substrate.

In an optical semiconductor device according to the present invention, the conductive layer includes a current blocking layer on the substrate and a contact layer on the optical waveguide and the current blocking layer.

In an optical semiconductor device according to the present invention, the conductive layer includes a first cladding layer on the optical waveguide and the alignment mark, and a second cladding layer on the substrate.

An optical semiconductor device according to the present invention comprises a first active layer in the same layer as the optical waveguide and a second active layer above the first active layer, relative to the substrate, the alignment mark serving as the second active layer.

An optical semiconductor device according to the present invention comprises a first active layer in the same layer as the optical waveguide and a second active layer under the first active layer, relative to the substrate, the alignment mark serving as the second active layer.

In an optical semiconductor device according to the present invention, the optical waveguide and the alignment mark are active layers in the same plane, and the thickness of the active layer that is the alignment mark is greater than that of the active layer of the optical waveguide.

In an optical semiconductor device according to the present invention, the optical waveguide and the alignment mark are active layers in the same plane and an electrical separation groove is provided between them.

In an optical semiconductor device according to the present invention, the alignment mark is a material having a bandgap energy narrower than the bandgap energies of the materials surrounding it.

A method of manufacturing an optical semiconductor device according to the present invention includes forming an optical waveguide on a substrate and forming an alignment mark at the same time as the optical waveguide.

A method of manufacturing an optical semiconductor device according to the present invention includes forming a conductive layer on the substrate after forming the optical waveguide and the alignment mark, forming an insulating film on the conductive layer, forming a front surface electrode on the insulating film, and forming a back surface electrode on a back surface of the substrate.

In a method of manufacturing an optical semiconductor device according to the present invention, forming a conductive layer includes forming a current blocking layer on the substrate after forming the optical waveguide and forming a contact layer on the optical waveguide and on the current blocking layer.

In a method of manufacturing an optical semiconductor device according to the present invention, forming a conductive layer includes forming a first cladding layer on the optical waveguide and on the alignment mark and forming a second cladding layer on the substrate.

In a method of manufacturing an optical semiconductor device according to the present invention, the optical waveguide and the alignment mark are active layers and are formed at the same time.

A method of manufacturing an optical semiconductor device according to the present invention includes forming a first active layer on the substrate at the same time as the optical waveguide and forming a second active layer as the alignment mark above the first active layer relative to the substrate.

A method of manufacturing an optical semiconductor device according to the present invention includes forming a first active layer on the substrate at the same time as the optical waveguide and forming a second active layer as the alignment mark under the first active layer relative to the substrate.

In a method of manufacturing an optical semiconductor device according to the present invention, the optical waveguide and the alignment mark are active layers and thickness of the active layer serving as the alignment mark is larger than the thickness of the active layer serving as the optical waveguide, the two layers being formed at the same time.

In a method of manufacturing an optical semiconductor device according to the present invention, the optical waveguide and the alignment mark are active layers and are formed at the same time, the method further including forming an electrical separation groove between them.

A method of manufacturing an optical semiconductor device according to the present invention includes cleaving a wafer using the alignment mark as a reference.

DESCRIPTION OF THE PREFERRED EMBODIMENTS

Embodiment 1

Figure 1A:
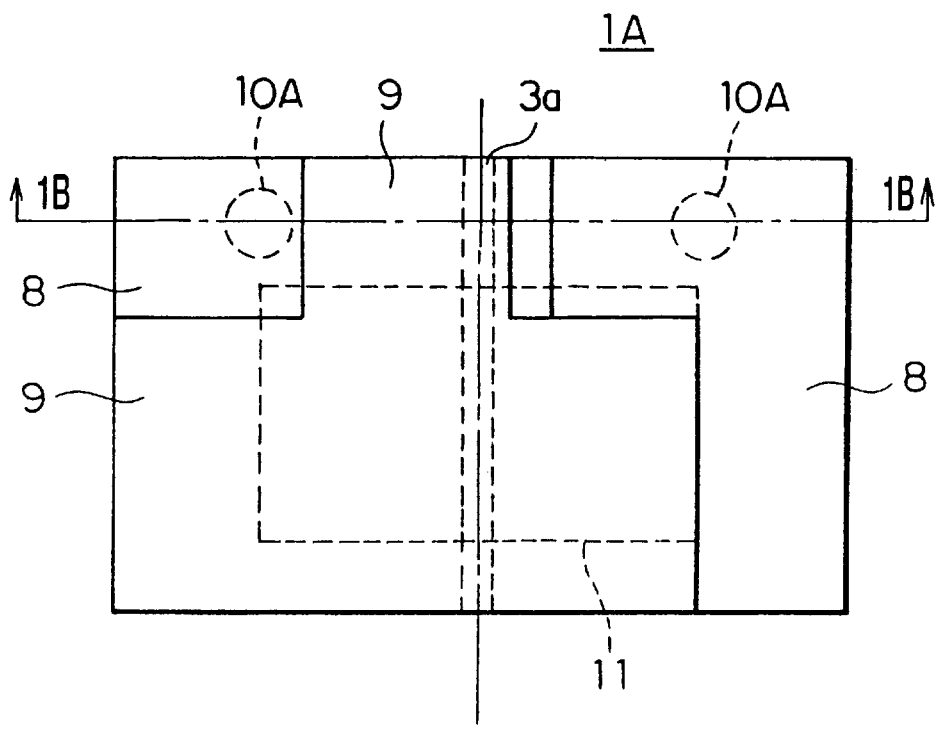
FIG. 1A is a plan view of a semiconductor laser chip according to an Embodiment 1 of the present invention.
Figure 1B:
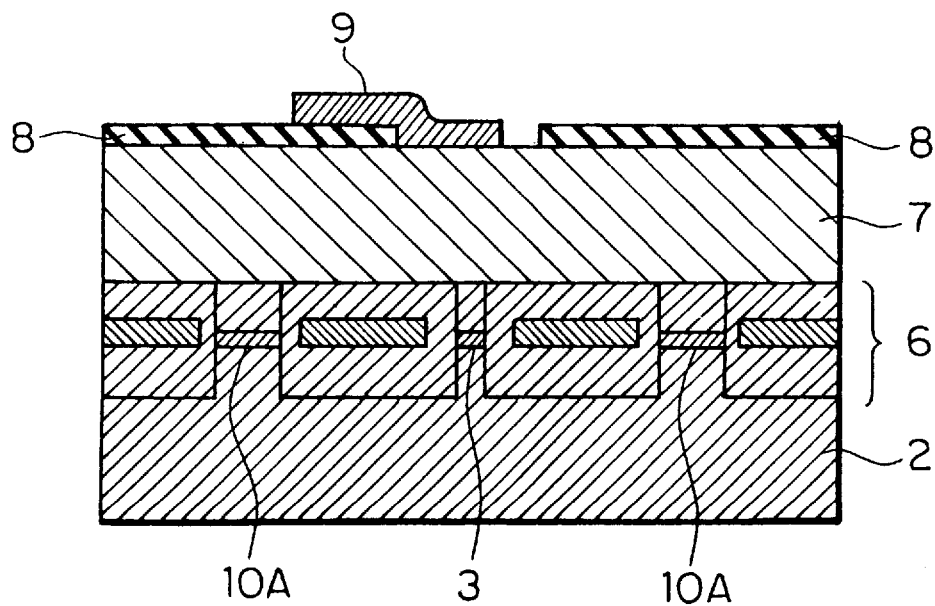
FIG. 1B is a sectional view of a semiconductor laser chip according to Embodiment 1 of the present invention.

A first embodiment of the present invention is described with reference to FIGS. 1A to 5C. FIG. 1A is a plan view of a semiconductor laser chip according to an Embodiment 1, of the present invention and FIG. 1B is a sectional view of the semiconductor laser chip taken along line 1B—1B of FIG. 1A. Further, FIGS. 2A to 4 are sectional views of the semiconductor laser chip according to Embodiment 1 in respective manufacturing process steps. Furthermore, FIGS. 5A to 5C illustrate a passive alignment method using the semiconductor laser chip. In the figures, like reference numerals denote like or corresponding portions.

Referring to FIGS. 1A and 1B, a semiconductor laser chip 1A according to Embodiment 1 of the present invention includes a p-type InP substrate 2, an InGaAsP active layer 3 (optical waveguide 3a) on the substrate 2, a p-n-p InP current blocking layer 6 on the substrate 2, a contact layer 7, an insulating film 8 on the contact layer 7, a front surface electrode 9 on the insulating film 8, a pair of alignment marks 10A formed at the same time as the optical waveguide 3a, and a back surface electrode 11 on the substrate 2. The alignment marks 10A are the same crystalline material as the optical waveguide 3a.

Figure 2A:
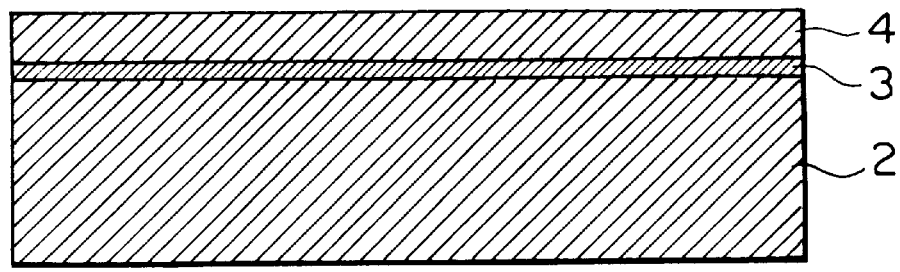
FIG. 2A is a sectional view in a process of manufacturing a semiconductor laser chip according to Embodiment 1 of the present invention.

A method of manufacturing the semiconductor laser chip according to Embodiment 1 will now be described. As shown in FIG. 2A, the InGaAsP active layer 3 and the n-type InP cladding layer 4 are grown, in sequence, on the p-type InP substrate 2, for example, by MOCVD (metal organic chemical vapor deposition).

Figure 2B:
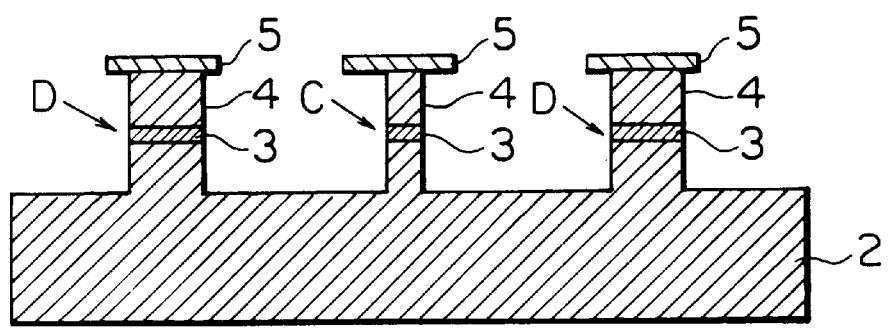
FIG. 2B is a sectional view in a process of manufacturing a semiconductor laser chip according to Embodiment 1 of the present invention.

As shown in FIG. 2B, an insulating film 5 is patterned in a photolithographic process and used as a mask to concurrently form a ridge C, which will be the optical waveguide 3a, and ridges D, which will be the alignment marks 10A, by mesa-etching, for example, using a Br-system etchant. The width of the ridge C, which will be the optical waveguide 3a, is, for example, of the order of 0.5–2.5 microns ($\mu$m), and the length is of the order of 100–1200 $\mu$m. Further, the ridge D which will be the alignment mark 10A is a circle having a diameter of the order of 0.5–100 μm, although the mark need not be circular.

Figure 3A:
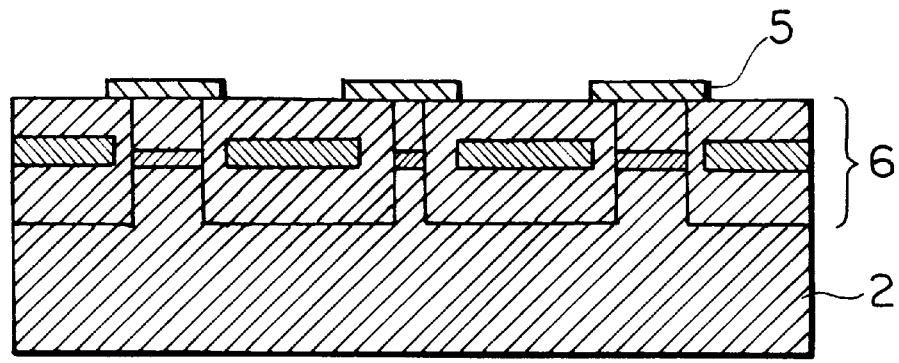
FIG. 3A is a sectional view in a process of manufacturing a semiconductor laser chip according to Embodiment 1 of the present invention.
Figure 3B:
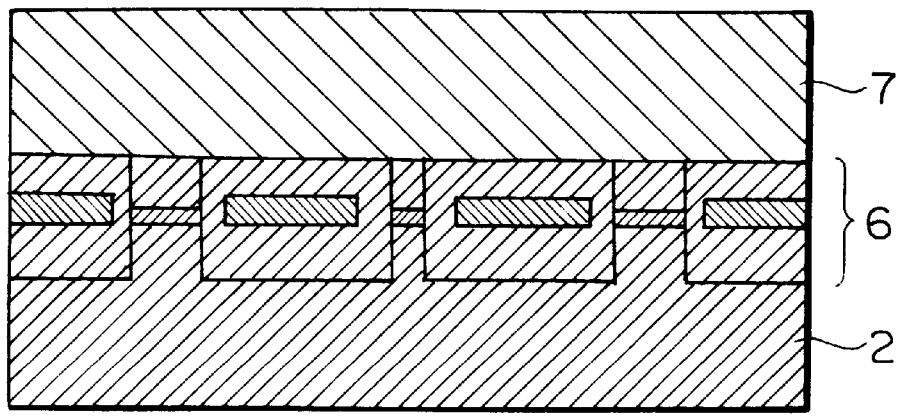
FIG. 3B is a sectional view in a process of manufacturing a semiconductor laser chip according to Embodiment 1 of the present invention.

As shown in FIG. 3A, the crystalline p-n-p InP current blocking layer 6 is selectively grown, for example, by MOCVD using the insulating film 5 as a mask. As shown in FIG. 3B, the insulating film 5 is removed and a contact layer 7 is grown, for example, by MOCVD.

Figure 4:
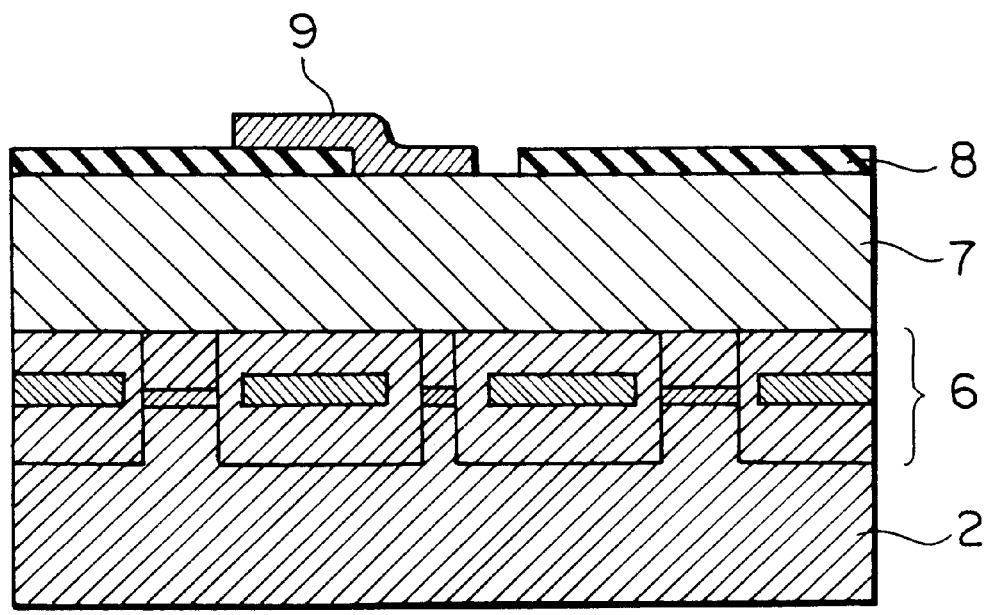
FIG. 4 is a sectional view in a process of manufacturing a semiconductor laser chip according to Embodiment 1 of the present invention.
Figure 5B:
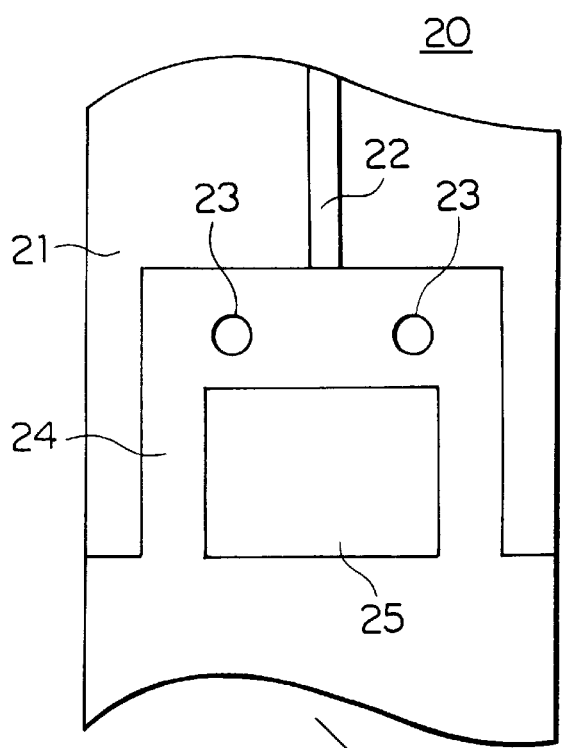
FIGS. 5A to 5C illustrate a passive alignment method using the semiconductor laser chip according to Embodiment 1 of the present invention.
Figure 5A:
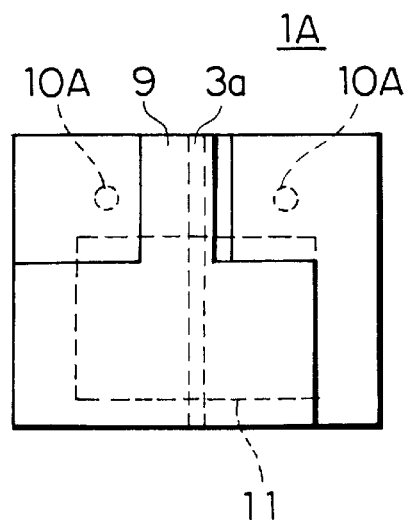
Figure 5C:
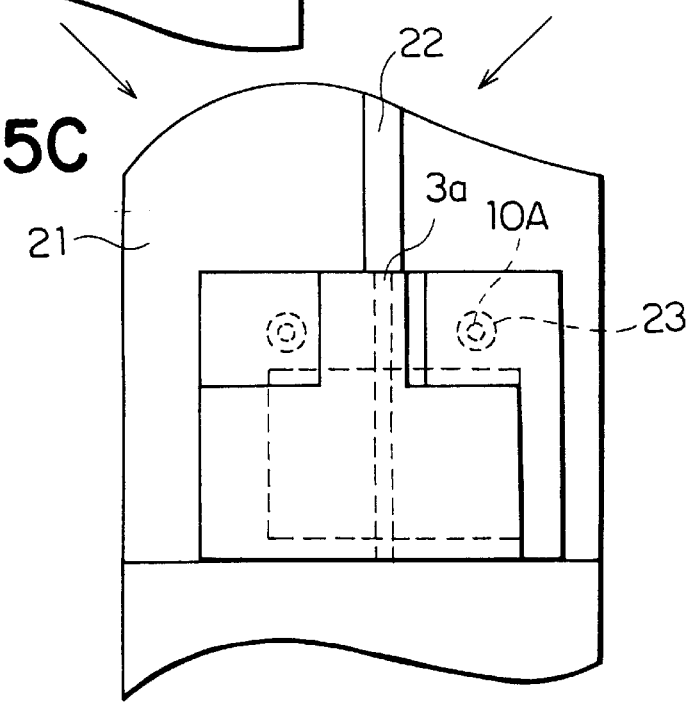

As shown in FIG. 4, an insulating film 8 is formed afresh, for example, by sputtering, and a stripe-shaped part of the insulating film 8 directly opposite the optical waveguide 3a is removed to make current injection possible. Finally, a front side electrode 9 on the n side and a back side electrode 11 on the p side are formed, for example, by vapor deposition or sputtering.

While an InP-system semiconductor laser chip has been described, the present invention may also be applied to such other materials as GaAs-system materials if the bandgap energy of the alignment mark 10A is smaller than the bandgap energies of the surrounding crystalline materials. In Embodiment 1, when forming the optical waveguide 3a, the InGaAsP active layer 3 remains in the shape of circles and is used as alignment marks 10A.

A description is given of a passive alignment method using the semiconductor laser chip 1A. The semiconductor laser chip 1A of FIG. 5A being aligned by means of infrared light is die-bonded as shown in FIG. 5C to a submount 20 of FIG. 5B.

The semiconductor laser chip 1A is placed on the submount 20, for example, by means of a vacuum tweezer, for coarse alignment. Pattern recognition using a metal pattern 24 for indicating the mounting position of the semiconductor laser chip 1A on the submount 20 and infrared light transmitted through the front surface electrode 9 or back surface electrode 11 of the semiconductor laser chip 1A is used for alignment. For example, infrared light incident upon the semiconductor laser chip 1A and transmitted is detected by an infrared CCD camera at the back surface of the submount 20.

At this coarse precision, the alignment mark 10A of the semiconductor laser chip 1A that does not transmit infrared light and the alignment mark 23 on the side of the submount 20 that transmits infrared light overlap as shown in FIG. 5C when infrared light is transmitted. The reason for this is that a crystalline active layer having a narrower bandgap energy than its surroundings functioning as the alignment mark 10A absorbs the infrared light. On the other hand, the crystalline material around the alignment mark 10A transmits the infrared light.

During transmission of the infrared light, alignment is achieved by making the respective centers of areas of the alignment marks 10A and 23 coincident. Then, the metal pattern 24 and the back surface electrode 11 are bonded to each other using a solder 25. Thereafter, an optical communication module is fabricated by mounting on the submount 20 an electrode for driving the semiconductor laser chip 1A, a photodiode for monitoring an output laser beam, etc.

In the fabricated optical communication module, die bonding is effected so that the optical waveguide 3a of the semiconductor laser chip 1A and the optical fiber 22 of the submount 20 are positioned with high precision so that a high and uniform coupling efficiency is obtained.

Embodiment 2

Figure 6A:
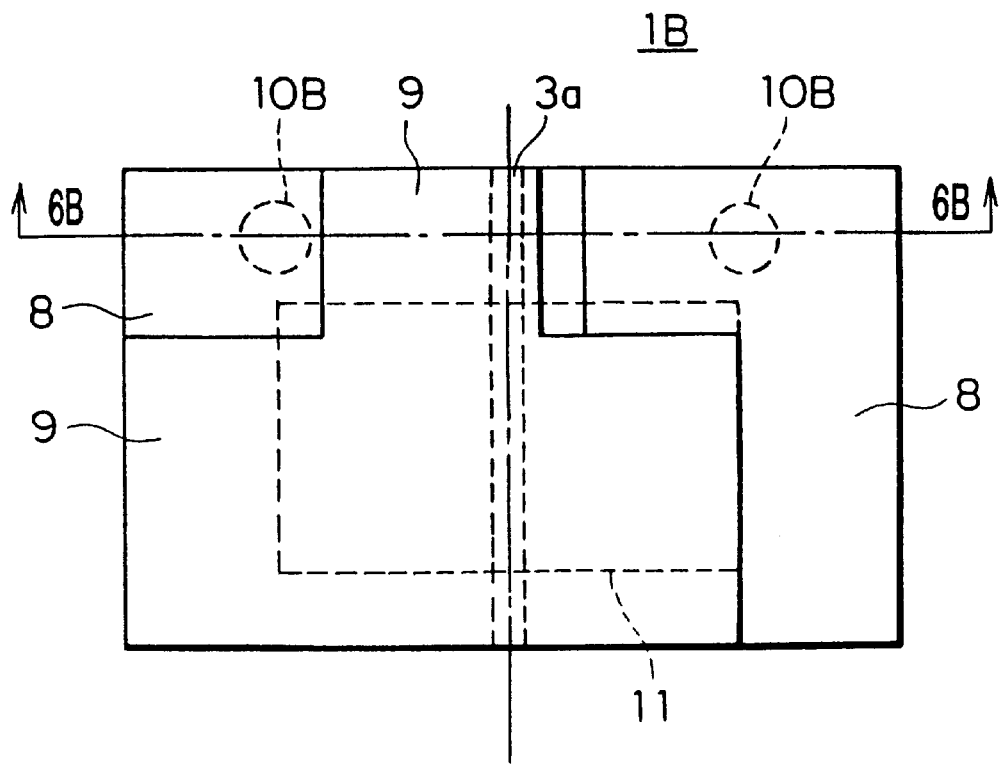
FIG. 6A is a plan view of a semiconductor laser chip according to an Embodiment 2 of the present invention.
Figure 6B:
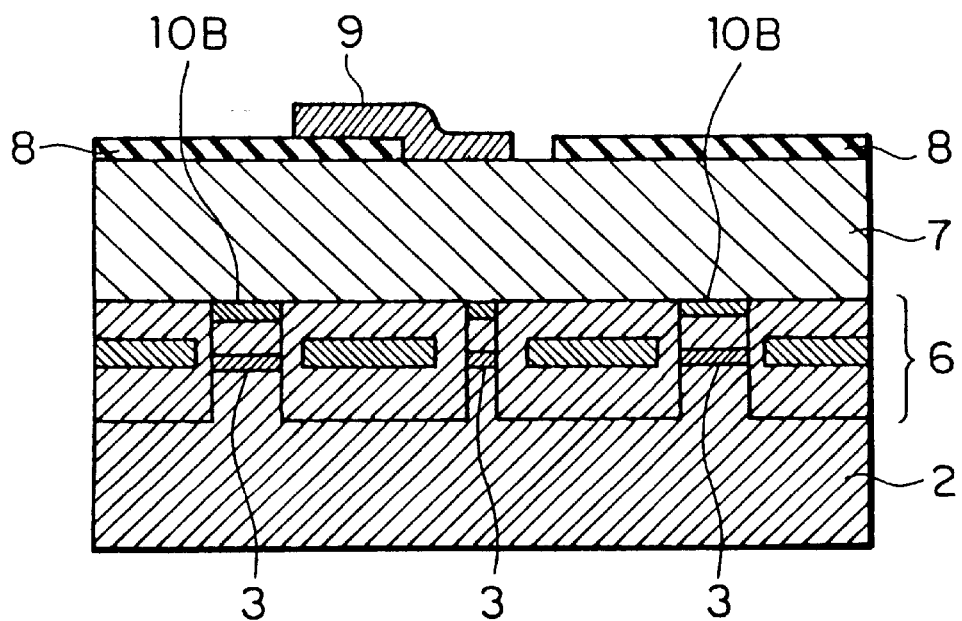
FIG. 6B is a sectional view of a semiconductor laser chip according to Embodiment 2 of the present invention.

A second embodiment of the present invention is described with reference to FIGS. 6A to 9B. FIG. 6A is a plan view of a semiconductor laser chip according to an Embodiment 2 of the present invention and FIG. 6B is a sectional view of the semiconductor laser chip taken along line 6B—6B of FIG. 6A. Further, FIGS. 7A to 9B are sectional views of the semiconductor laser chip according to Embodiment 2 in respective manufacturing process steps.

Referring to FIGS. 6A and 6B, a semiconductor laser chip 1B according to Embodiment 2 of the present invention includes a p-type InP substrate 2, an InGaAsP active layer 3 (optical waveguide 3a), a p-n-p InP current blocking layer 6, a contact layer 7, an insulating film 8, a front surface electrode 9, a pair of alignment marks 10B extending over the active layer 3 and formed at the same time as the optical waveguide 3a, and a back surface electrode 11. The alignment marks 10B are an infrared absorbing layer with a narrower bandgap energy or a larger thickness than the active layer 3.

Figure 7A:
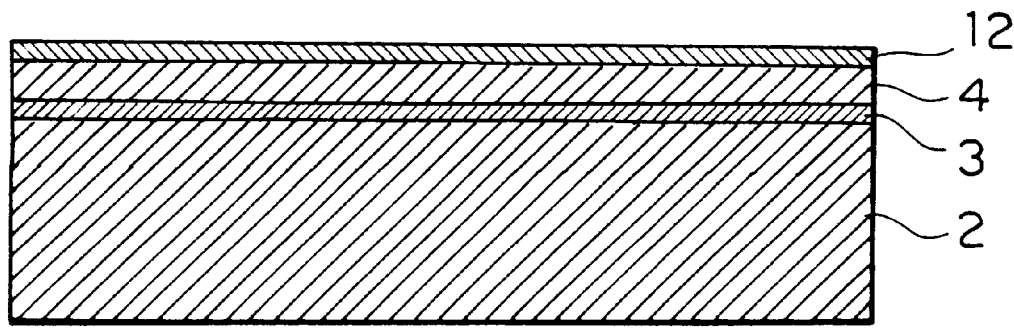
FIG. 7A is a sectional view in a process of manufacturing a semiconductor laser chip according to Embodiment 2 of the present invention.

A method of manufacturing the semiconductor laser chip according to Embodiment 2 will now be described. As shown in FIG. 7A, the InGaAsP active layer 3, the n-type InP cladding layer 4, and an infrared absorbing layer 12 consisting of InGaAsP, which is to become the alignment mark 10B, are grown, in sequence, on the p-type InP substrate 2, for example, by MOCVD.

Figure 7B:
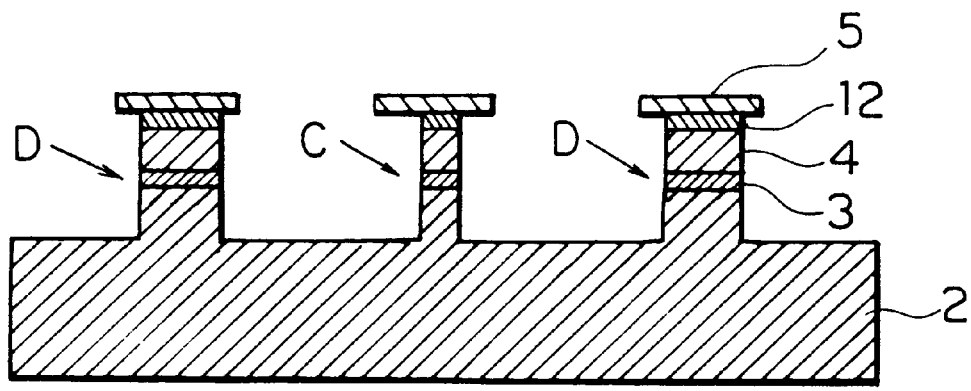
FIG. 7B is a sectional view in a process of manufacturing a semiconductor laser chip according to Embodiment 2 of the present invention.

As shown in FIG. 7B, an insulating film 5 is patterned in a photolithographic process and used as a mask to concurrently form a ridge C, which will be the optical waveguide 3a, and ridges D, which will be the alignment marks 10B, by means of mesa-etching, for example, using a Br-system etchant. The width of the ridge C which will be the optical waveguide 3a is, for example, of the order of 0.5–2.5 μm, and the length is of the order of 100–1200 μm. Further, the ridge D is a circle having a diameter, for example, of the order of 0.5–100 μm, although it need not be circular.

Figure 8A:
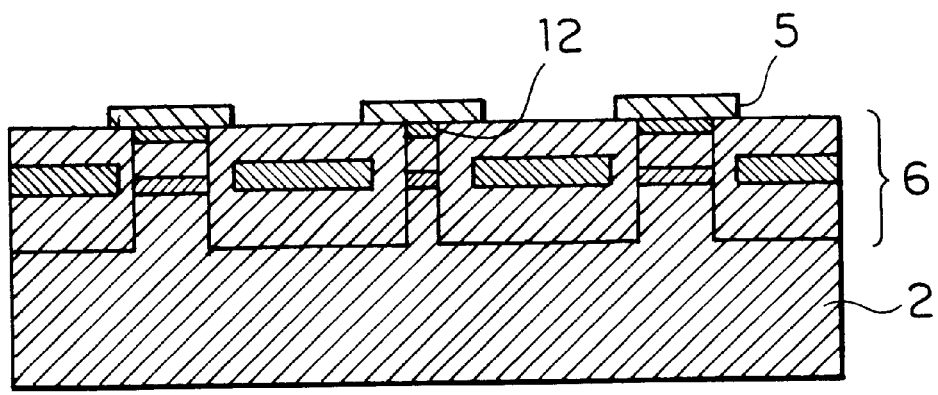
FIG. 8A is a sectional view in a process of manufacturing a semiconductor laser chip according to Embodiment 2 of the present invention.
Figure 8B:
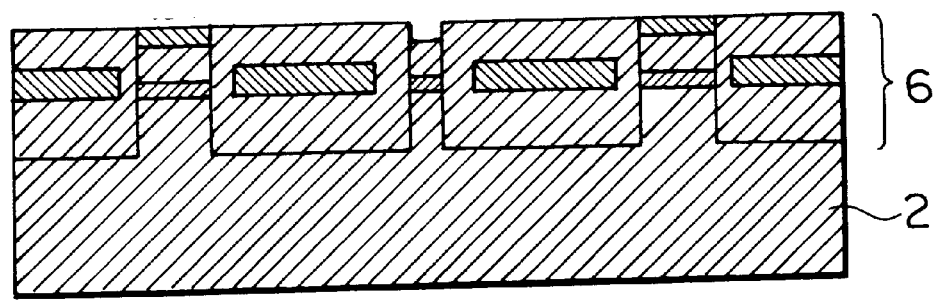
FIG. 8B is a sectional view in a process of manufacturing a semiconductor laser chip according to Embodiment 2 of the present invention.

As shown in FIG. 8A, a crystalline p-n-p InP current blocking layer 6 is selectively grown, for example, by MOCVD using the insulating film 5 as a mask. As shown in FIG. 8B, the insulating film 5 is removed and the infrared absorbing layer 12 directly opposite the InGaAsP active layer 3 which is to become the optical waveguide 3a is removed, for example, by etching using nitric acid. The infrared absorbing layer 12 directly above the InGaAsP active layer 3 which is to become the optical waveguide 3a is removed to eliminate the problem of absorption of laser light.

Figure 9A:
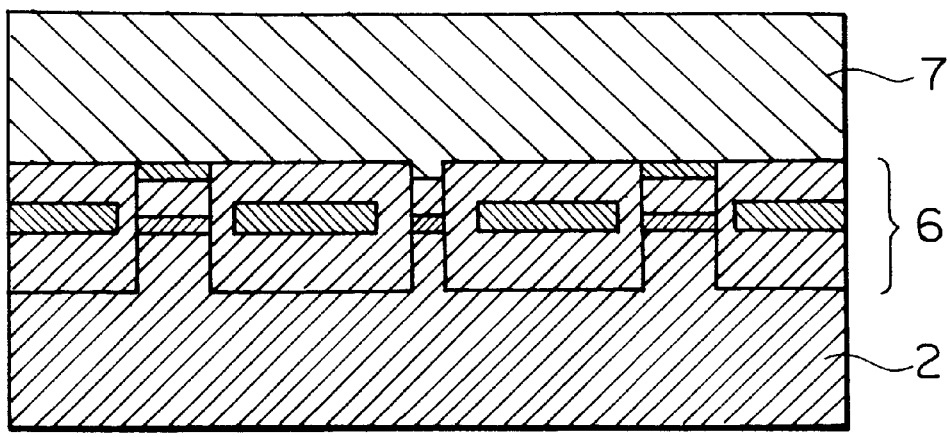
FIG. 9A is a sectional view in a process of manufacturing a semiconductor laser chip according to Embodiment 2 of the present invention.
Figure 9B:
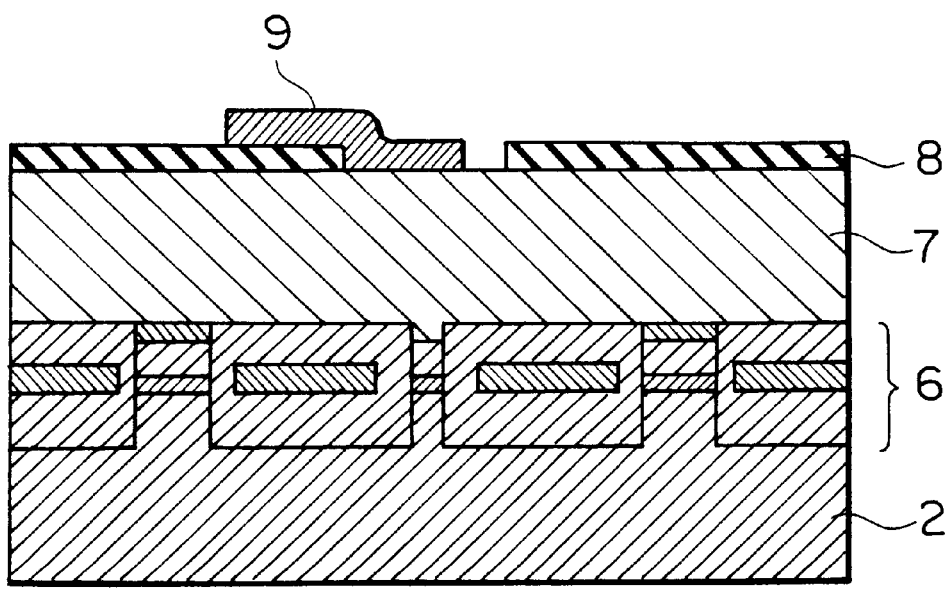
FIG. 9B is a sectional view in a process of manufacturing a semiconductor laser chip according to Embodiment 2 of the present invention.

As shown in FIG. 9A, after removing the insulating film 5 and the infrared absorbing layer 12, a crystalline contact layer 7 is grown, for example, by MOCVD. As shown in FIG. 9B, an insulating film 8 is formed afresh, for example, by sputtering, and a stripe-shaped part of the insulating film 8 directly above the optical waveguide 3a is removed to make current injection possible. Finally, a front side electrode 9 on the n side and a back side electrode 11 on the p side are formed, for example, by vapor deposition or sputtering.

In Embodiment 1, the InGaAsP active layer 3 is used as the alignment mark 10A; in Embodiment 2, however, the infrared absorbing layer 12, absorbing a greater amount of infrared light than the active layer 3 because it has a narrower bandgap energy or a larger thickness than the active layer 3, is inserted as shown in FIG. 6B into the semiconductor laser chip 1B at a position directly above the InGaAsP active layer 3.

With such a construction, the alignment mark 10B can be seen with more conspicuous contrast in pattern recognition, based on transmitted infrared light, compared to Embodiment 1 where only the active layer 3 is used as the alignment mark 10A, whereby the precision of die bonding is improved. Since the same passive alignment method for Embodiment 1 is used for this embodiment, description of it is omitted.

Embodiment 3

Figure 10A:
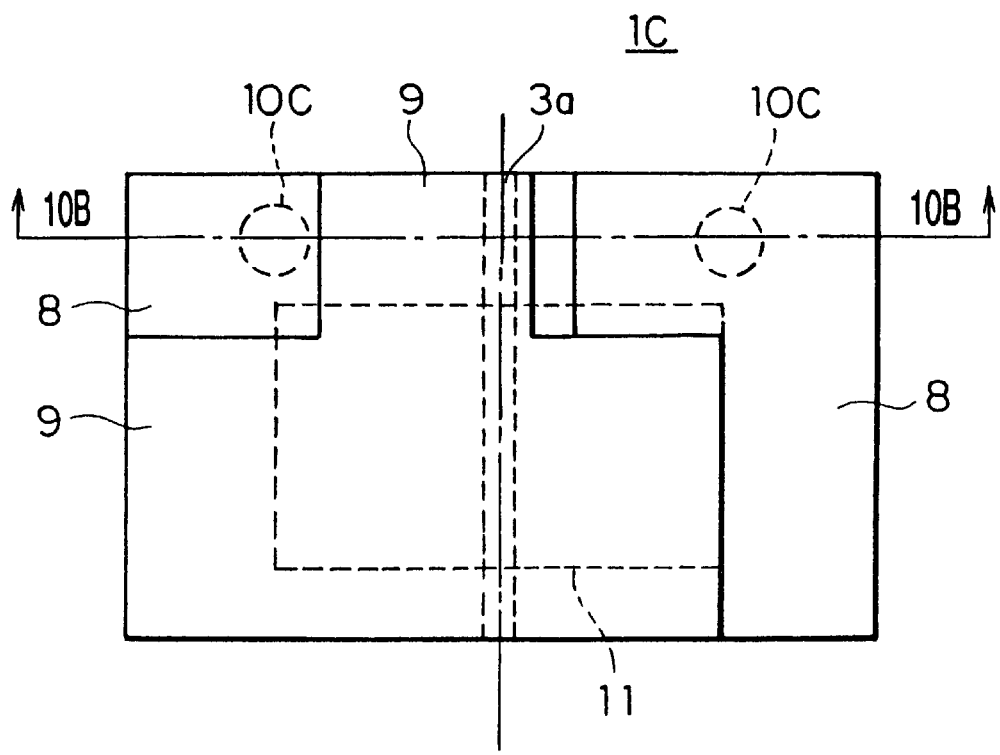
FIG. 10A is a plan view of a semiconductor laser chip according to an Embodiment 3 of the present invention.
Figure 10B:
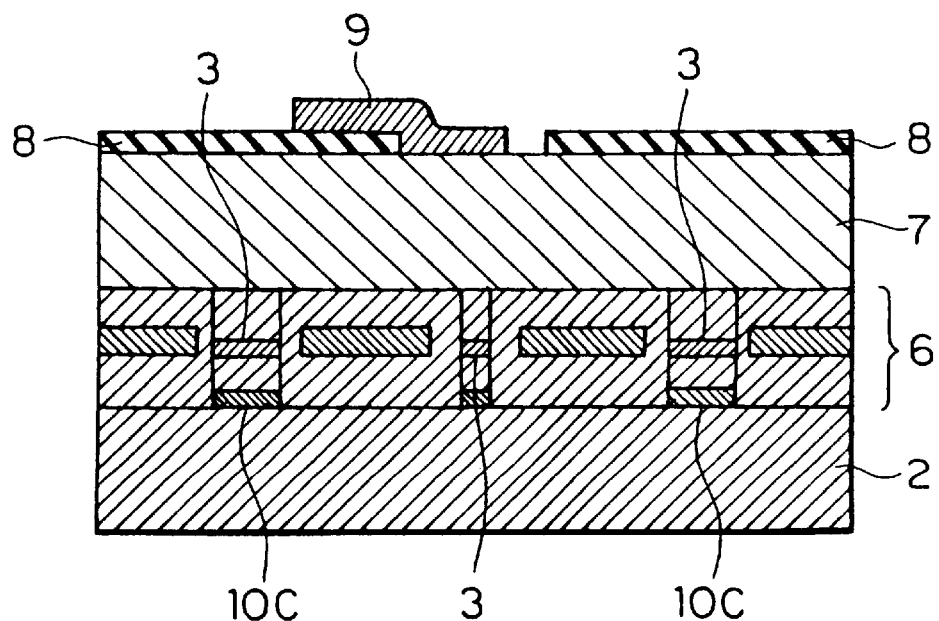
FIG. 10B is a sectional view of a semiconductor laser chip according to Embodiment 3 of the present invention.

A third embodiment of the present invention is described with reference to FIGS. 10A to 13. FIG. 10A is a plan view of a semiconductor laser chip according to an Embodiment 3 of the present invention and FIG. 10B is a sectional view of the semiconductor laser chip taken along line 10B—10B of FIG.10A. FIGS. 11A to 13 are sectional views of the semiconductor laser chip according to Embodiment 3 in respective manufacturing process steps.

Referring to FIGS. 10A and 10B, a semiconductor laser chip 1C according to Embodiment 3 of the present invention includes a p-type InP substrate 2, an InGaAsP active layer 3 (optical waveguide 3a), a p-n-p InP current blocking layer 6, a contact layer 7, an insulating film 8, a front surface electrode 9, a pair of alignment marks 10C under the active layer 3 and formed at the same time as the optical waveguide 3a, and a back surface electrode 11. The alignment marks 10C are an infrared absorbing layer with a narrower bandgap energy or a larger thickness than the active layer 3.

Figure 11A:
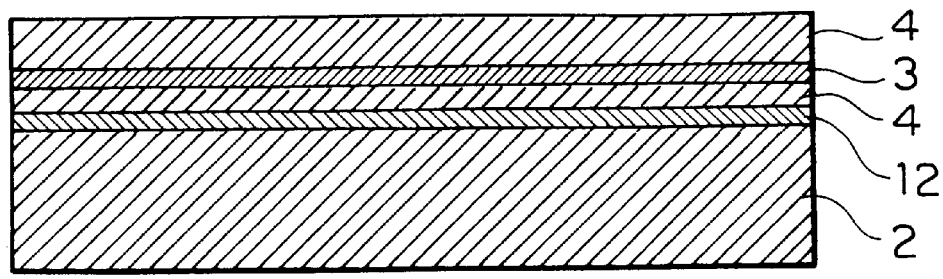
FIG. 11A is a sectional view in a process of manufacturing a semiconductor laser chip according to Embodiment 3 of the present invention.

A method of manufacturing the semiconductor laser chip according to Embodiment 3 will now be described. As shown in FIG. 11A, an infrared absorbing layer 12 consisting of an InGaAsP layer that is to become the alignment mark 10C, an n-type InP cladding layer 4, an InGaAsP active layer 3, and another n-type InP cladding layer 4 are grown, in sequence, on the p-type InP substrate 2, for example, by MOCVD.

Figure 11B:
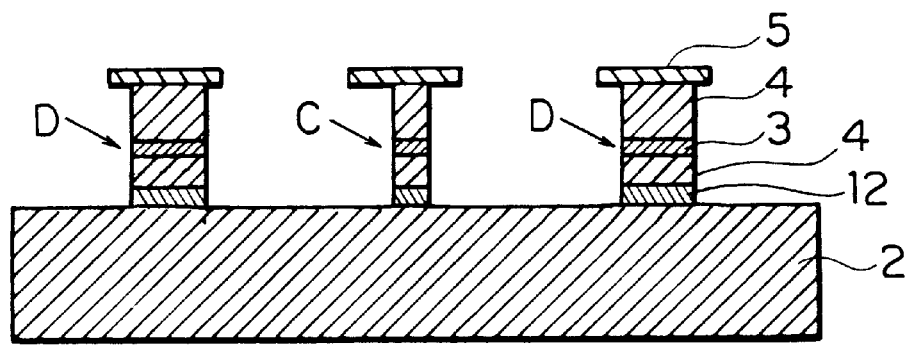
FIG. 11B is a sectional view in a process of manufacturing a semiconductor laser chip according to Embodiment 3 of the present invention.

As shown in FIG. 11B, an insulating film 5 is patterned in a photolithographic process and used as a mask to concurrently form a ridge C, which will be the optical waveguide 3a, and ridges D, which will be the alignment marks 10C, by mesa-etching, for example, using a Br-system etchant. The width of ridge C which will be the optical waveguide 3a is, for example, of the order of 0.5–2.5 $\mu$m, and the length is of the order of 100–1200 $\mu$m. Further, the ridge D which will be the alignment mark 10C is a circle having a diameter, for example, of the order of 0.5–100 $\mu$m, although it need not be circular.

Figure 12A:
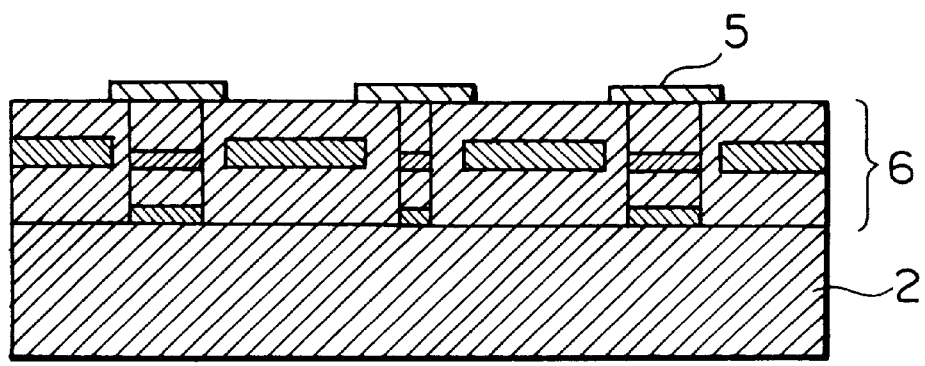
FIG. 12A is a sectional view in a process of manufacturing a semiconductor laser chip according to Embodiment 3 of the present invention.
Figure 12B:
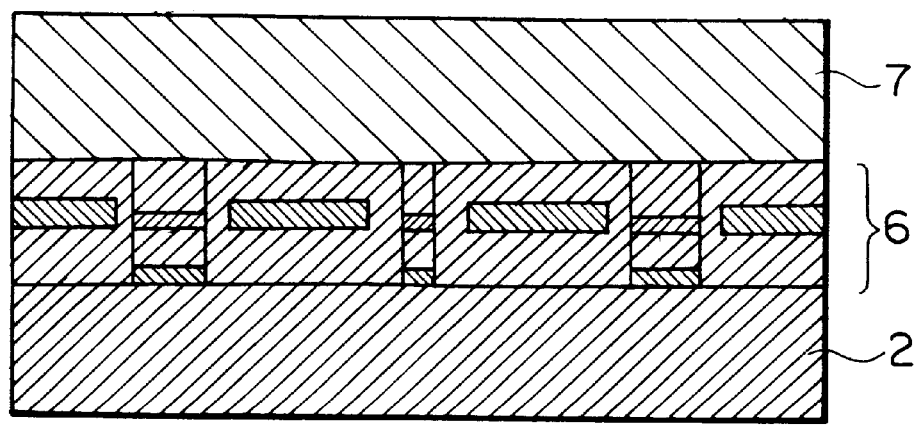
FIG. 12B is a sectional view in a process of manufacturing a semiconductor laser chip according to Embodiment 3 of the present invention.

As shown in FIG. 12A, a crystalline p-n-p InP current blocking layer 6 is grown, for example, by MOCVD using the insulating film 5 as a mask. As shown in FIG. 12B, the insulating film 5 is removed and a crystalline contact layer 7 is grown, for example, by MOCVD.

Figure 13:
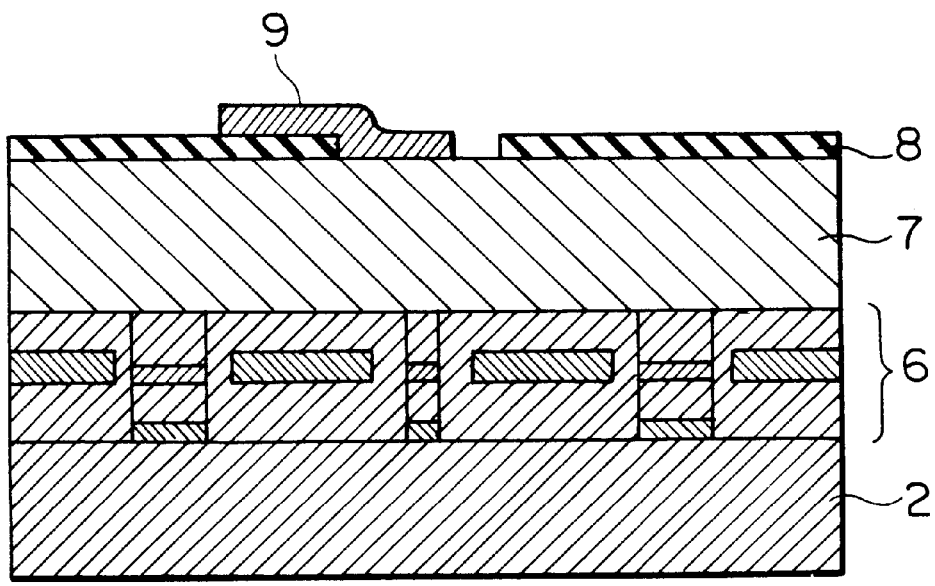
FIG. 13 is a sectional view in a process of manufacturing a semiconductor laser chip according to Embodiment 3 of the present invention.

As shown in FIG. 13, an insulating film 8 is formed afresh by deposition, for example, by sputtering, and a stripe-shaped part of the insulating film 8 directly above the optical waveguide 3a is removed to make current injection possible. Finally, a front side electrode 9 on the n side and a back side electrode 11 on the p side are formed, for example, by vapor deposition or sputtering.

In Embodiment 2, the infrared absorbing layer 12, absorbing a greater amount of infrared light than the active layer 3 because it has a narrower bandgap energy or a larger thickness than the active layer 3, is inserted in the semiconductor laser chip 1B at a position directly above the InGaAsP active layer 3; in Embodiment 3, however, an infrared absorbing layer 12 is located directly below the InGaAsP active layer 3.

With such a construction, the alignment mark 10C may be seen with a more conspicuous contrast in pattern recognition, based on transmitted infrared light, than in Embodiment 1 where only the active layer 3 is used as the alignment mark 10A, whereby the precision of die bonding is improved. Since the same description of the passive alignment method for Embodiment 1 suffices for this embodiment, it will be omitted.

Embodiment 4

Figure 14A:
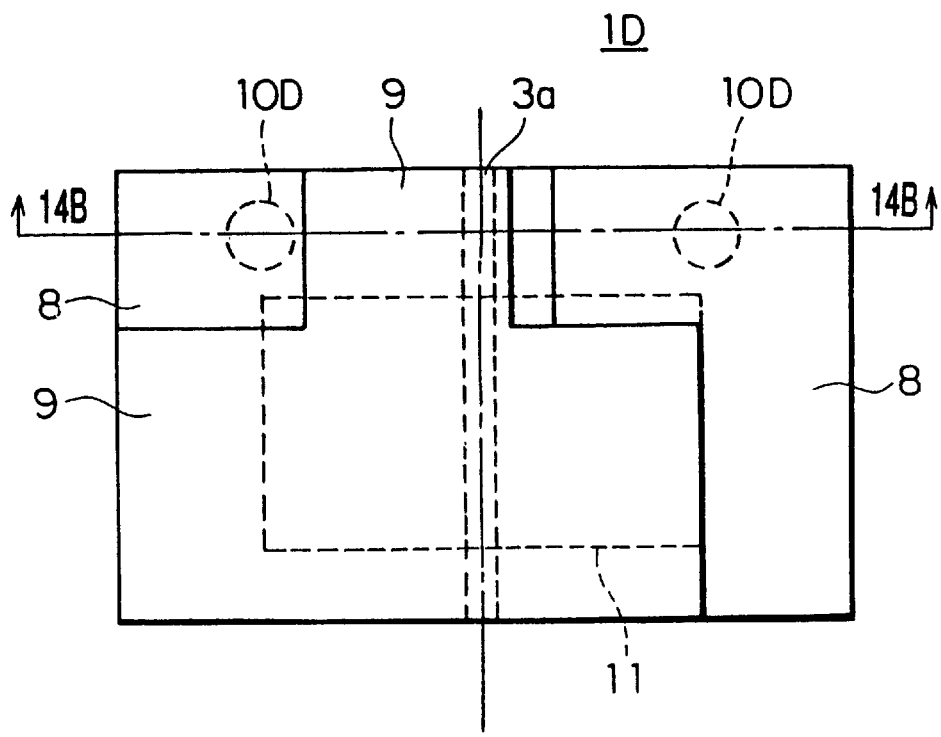
FIG. 14A is a plan view of a semiconductor laser chip according to an Embodiment 4 of the present invention.
Figure 14B:
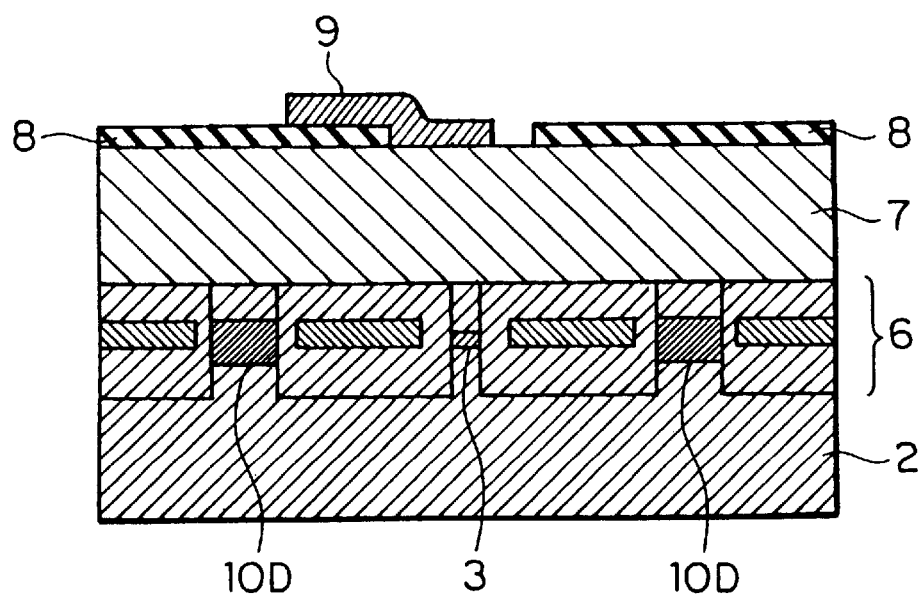
FIG. 14B is a sectional view of a semiconductor laser chip according to Embodiment 4 of the present invention.

A fourth embodiment of the present invention is described with reference to FIGS. 14A to 17B. FIG. 14A is a plan view of a semiconductor laser chip according to an Embodiment 4 of the present invention and FIG. 14B is a sectional view of the semiconductor laser chip taken along line 14B—14B of FIG. 14A. Further, FIGS. 15A to 17B are sectional views of the semiconductor laser chip according to Embodiment 4 of respective manufacturing process steps.

Referring to FIGS. 14A and 14B, a semiconductor laser chip 1D according to Embodiment 4 of the present invention includes a p-type InP substrate 2, an InGaAsP active layer 3 (optical waveguide 3a), a p-n-p InP current blocking layer 6, a contact layer 7, an insulating film 8, a front surface electrode 9, a pair of alignment marks 10D formed at the same time as the optical waveguide 3a, and a back surface electrode 11. The alignment marks 10D have a smaller bandgap energy and a larger thickness than the active layer 3.

Figure 15A:
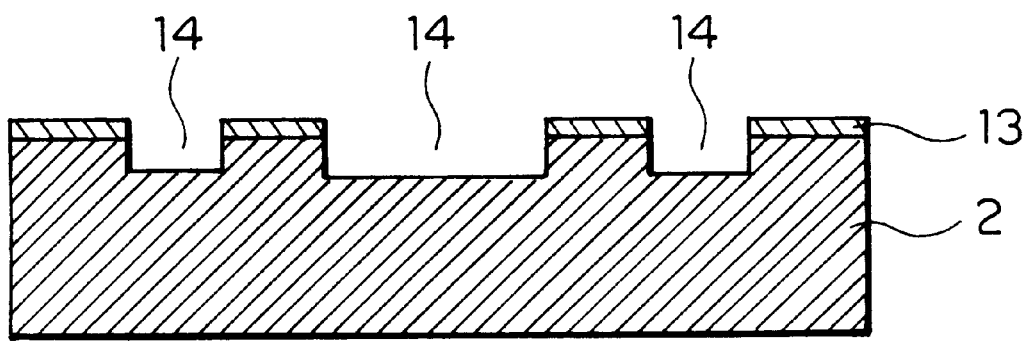
FIG. 15A is a sectional view in a process of manufacturing a semiconductor laser chip according to Embodiment 4 of the present invention.

A method of manufacturing the semiconductor laser chip according to Embodiment 4 will now be described. As shown in FIG. 15A, an insulating layer 13 is formed on the p-type InP substrate 2 by vapor deposition or sputtering and used as a selective growth mask for an active layer and to form a selective growth groove 14, for example, by etching using a nitric acid-system etchant.

Figure 15B:
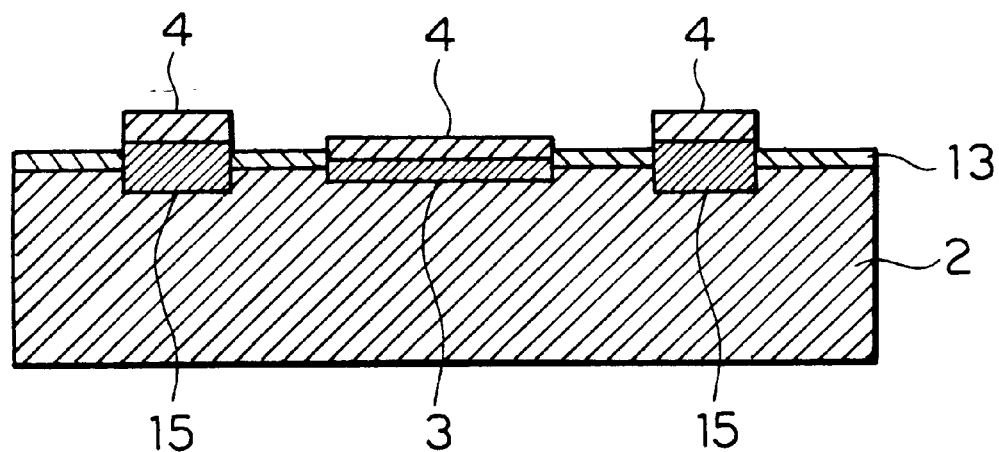
FIG. 15B is a sectional view in a process of manufacturing a semiconductor laser chip according to Embodiment 4 of the present invention.

As shown in FIG. 15B, InGaAsP active layer 3 and InP cladding layer 4 are selectively grown in the selective growth groove 14, for example, by MOCVD; the portion where the active layer 3 has a greater thickness results in an infrared absorbing layer 15 which is to become the alignment marks 10D.

Figure 16A:
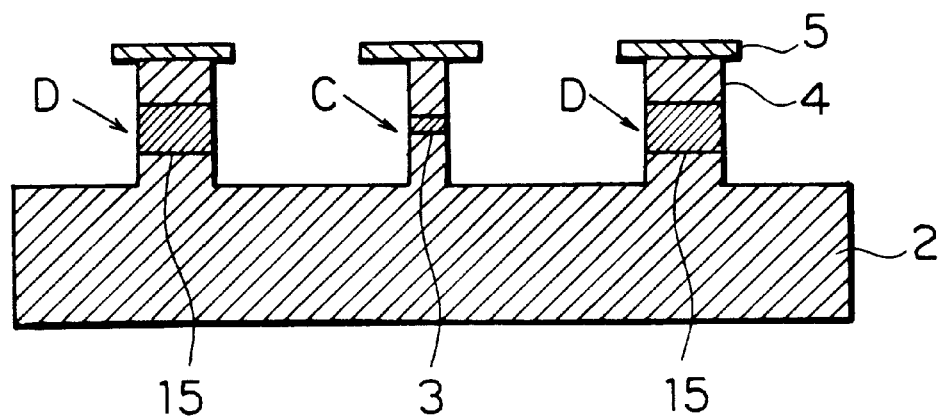
FIG. 16A is a sectional view in a process of manufacturing a semiconductor laser chip according to Embodiment 4 of the present invention.

As shown in FIG. 16A, an insulating film 5 is patterned in a photolithographic process and used as a mask to concurrently form a ridge C, which will be the optical waveguide 3a, and ridges D, which will be the alignment marks 10D, by means of mesa-etching, for example, using a Br-system etchant. The width of ridge C which will be the optical waveguide 3a is, for example, of the order of 0.5–2.5 $\mu$m, and its length is of the order of 100–1200 $\mu$m. Further, the ridge D which will be the alignment mark 10C is a circle having a diameter, for example, of the order of 0.5–100 $\mu$m, although it need not be circular.

Figure 16B:
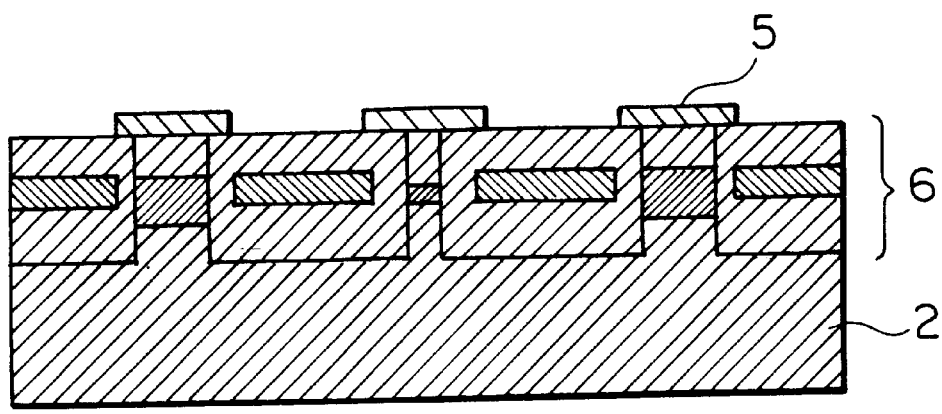
FIG. 16B is a sectional view in a process of manufacturing a semiconductor laser chip according to Embodiment 4 of the present invention.
Figure 17A:
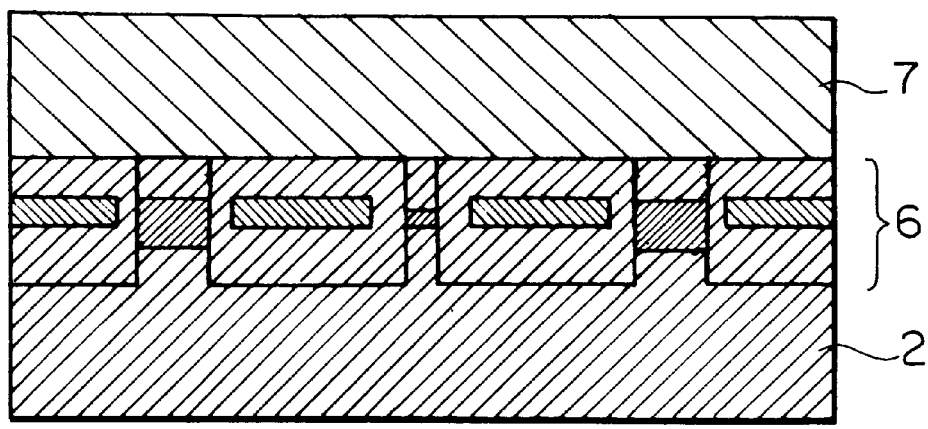
FIG. 17A is a sectional view in a process of manufacturing a semiconductor laser chip according to Embodiment 4 of the present invention.

As shown in FIG. 16B, the crystalline p-n-p InP current blocking layer 6 is grown, for example, by MOCVD using the insulating film 5 as a mask. As shown in FIG. 17A, the insulating film 5 is removed and a crystalline contact layer 7 is grown, for example, by MOCVD.

Figure 17B:
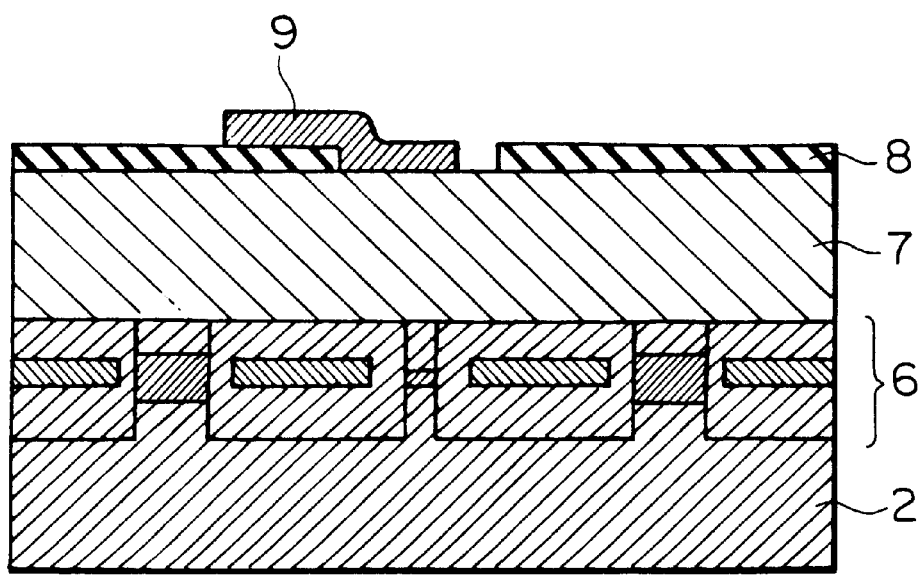
FIG. 17B is a sectional view in a process of manufacturing a semiconductor laser chip according to Embodiment 4 of the present invention.

As shown in FIG. 17B, an insulating film 8 is formed afresh by deposition, for example, by sputtering, and a stripe-shaped part of the insulating film 8 directly opposite the optical waveguide 3a is removed to make current injection possible. Finally, a front side electrode 9 on the n side and a back side electrode 11 on the p side are formed, for example, by vapor deposition or sputtering.

In Embodiments 2 and 3, the infrared absorbing layer 12, absorbing a larger amount of infrared light than the active layer 3 because it has a narrower bandgap energy or a larger thickness than the active layer 3, is located directly above or below the InGaAsP active layer 3; in Embodiment 4, however, the alignment mark 10D is produced by selective growth as a layer having a smaller bandgap energy and a larger thickness, i.e., absorbing a larger amount of infrared light than the InGaAsP active layer 3.

The alignment mark 10D may be seen with a more conspicuous contrast in pattern recognition, based on transmitted infrared light, compared to Embodiment 1 where only the active layer 3 is used as the alignment mark 10A, whereby the precision of die bonding is improved. Since the same description with respect to the passive alignment method for Embodiment 1 suffices for this embodiment, it is omitted.

Embodiment 5

Figure 18A:
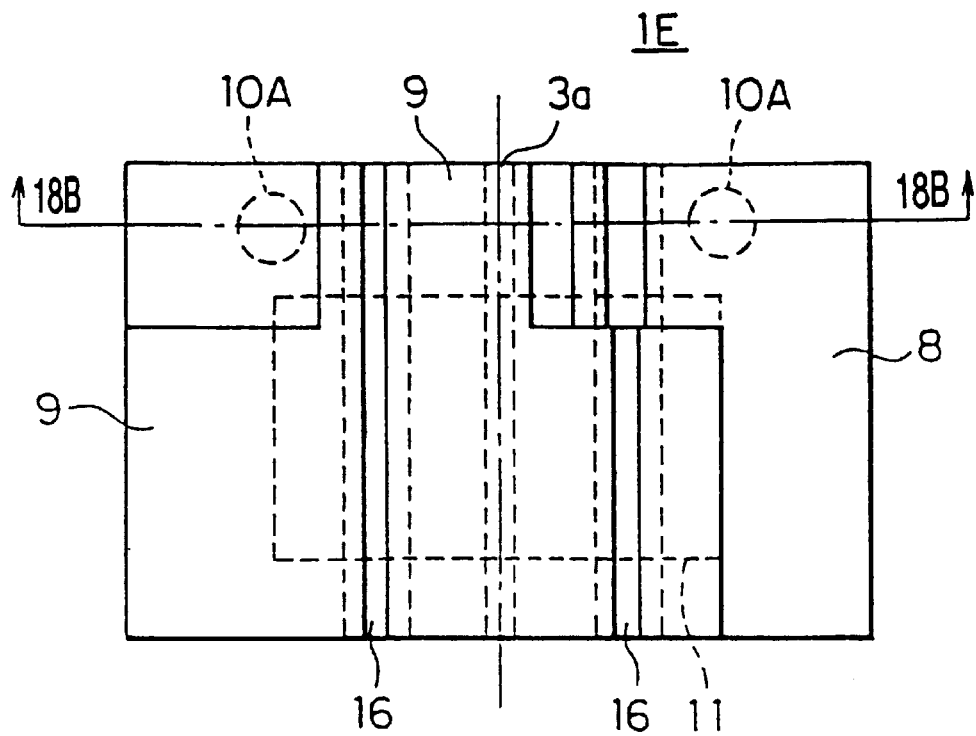
FIG. 18A is a plan view of a semiconductor laser chip according to an Embodiment 5 of the present invention.
Figure 18B:
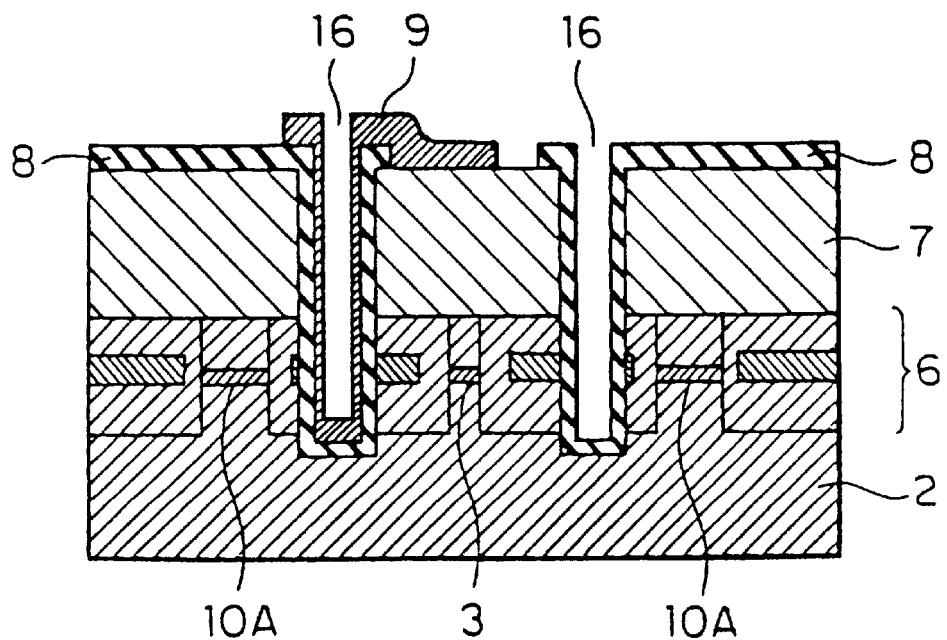
FIG. 18B is a sectional view of a semiconductor laser chip according to Embodiment 5 of the present invention.

A fifth embodiment of the present invention is described with reference to FIGS. 18A to 21B. FIG. 18A is a plan view of a semiconductor laser chip according to Embodiment 5 of the present invention; and FIG. 18B is a sectional view of the semiconductor laser chip taken along line 18B—18B of FIG. 18A. Further, FIGS. 19A to 21B are sectional views of the semiconductor laser chip according to Embodiment 5 in respective manufacturing process steps.

Referring to FIGS. 18A and 18B, a semiconductor laser chip 1E according to Embodiment 5 of the present invention includes a p-type InP substrate 2, an InGaAsP active layer 3 (optical waveguide 3a), a p-n-p InP current blocking layer 6, a contact layer 7, an insulating film 8, a front surface electrode 9, a pair of alignment marks 10A formed at the same time as the optical waveguide 3a, a back surface electrode 11, and an electrical separation groove 16.

Figure 19A:
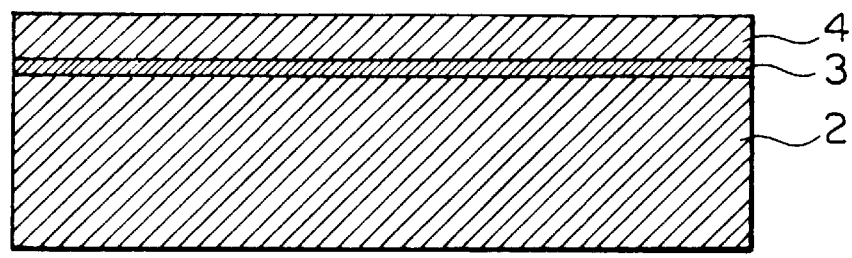
FIG. 19A is a sectional view in a process of manufacturing a semiconductor laser chip according to Embodiment 5 of the present invention.

A method of manufacturing the semiconductor laser chip according to Embodiment 5 will now be described. As shown in FIG. 19A, the InGaAsP active layer 3 and the n-type InP cladding layer 4 are grown, in sequence, on p-type InP substrate 2, for example, by MOCVD.

Figure 19B:
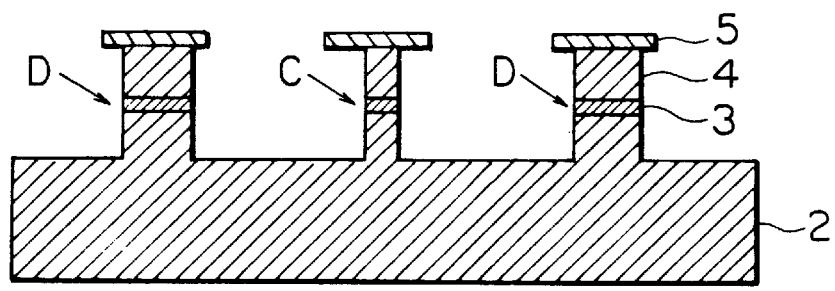
FIG. 19B is a sectional view in a process of manufacturing a semiconductor laser chip according to Embodiment 5 of the present invention.

As shown in FIG. 19B, an insulating film 5 is patterned by a photolithographic process and used as a mask to concurrently form a ridge C, which will be the optical waveguide 3a, and ridges D, which will be the alignment marks 10A, by means of mesa-etching, for example, using a Br-system etchant. The width of ridge C which will be the optical waveguide 3a is, for example, of the order of 0.5–2.5 $\mu$m, and the length is of the order of 100–1200 $\mu$m. Further, the ridge D which will be the alignment mark 10A is a circle having a diameter for example of the order of 0.5–100 $\mu$m, although it need not be circular.

Figure 20A:
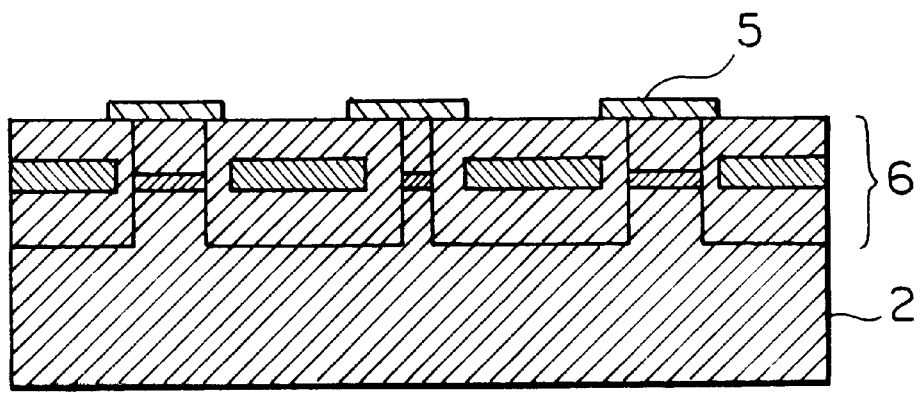
FIG. 20A is a sectional view in a process of manufacturing a semiconductor laser chip according to Embodiment 5 of the present invention.
Figure 20B:
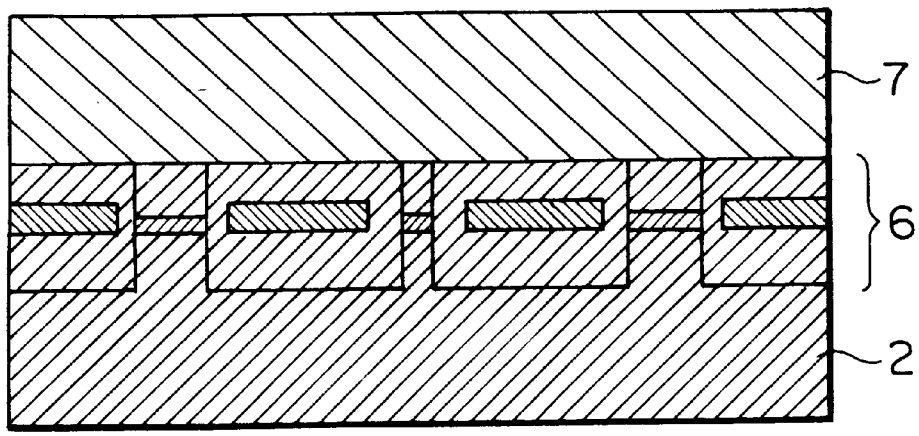
FIG. 20B is a sectional view in a process of manufacturing a semiconductor laser chip according to Embodiment 5 of the present invention.

As shown in FIG. 20A, the crystalline p-n-p InP current blocking layer 6 is grown, for example, by MOCVD using the insulating film 5 as a mask. As shown in FIG. 20B, the insulating film 5 is removed and a contact layer 7 is formed by crystal growth, for example, by MOCVD.

Figure 21A:
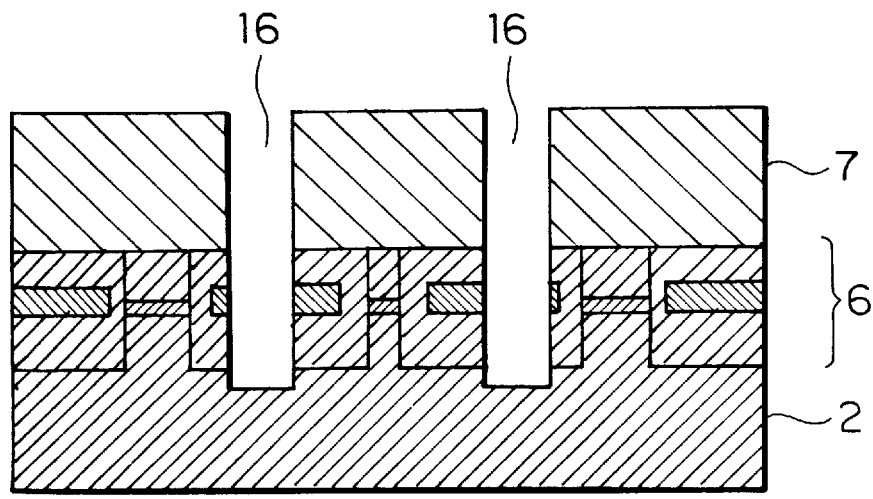
FIG. 21A is a sectional view in a process of manufacturing a semiconductor laser chip according to Embodiment 5 of the present invention.
Figure 21B:
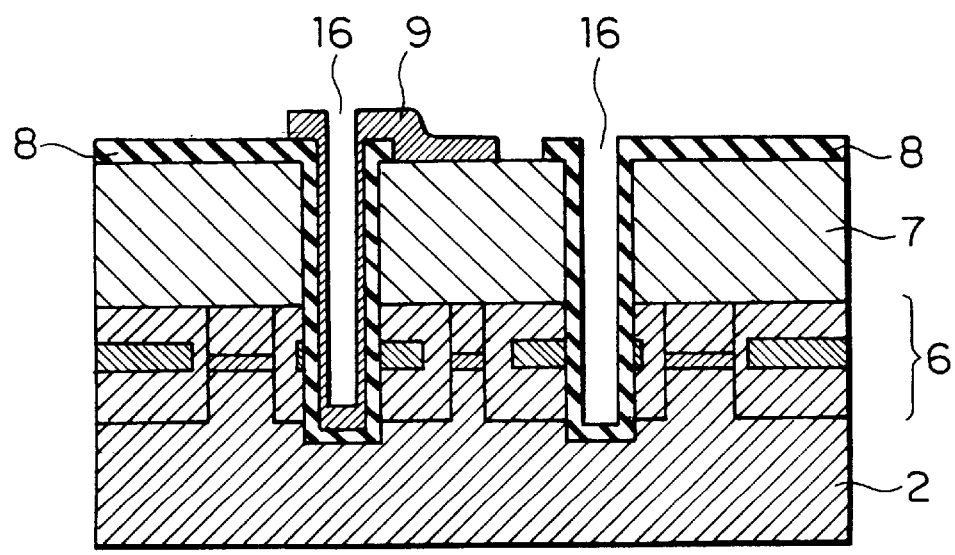
FIG. 21B is a sectional view in a process of manufacturing a semiconductor laser chip according to Embodiment 5 of the present invention.

As shown in FIG. 21A, photoresist is used as a mask to form electrical separation grooves 16 by means of etching using a Br-system etchant. As shown in FIG. 21B, an insulating film 8 is formed afresh by deposition, for example, by sputtering, and a stripe-shaped part of the insulating film 8 directly above the optical waveguide 3a is removed to make current injection possible. Finally, a front side electrode 9 on the n side and a back side electrode 11 on the p side are formed, for example, by vapor deposition using sputtering.

By using the construction where the electrical separation grooves 16 as described above are provided, the possibility of leakage current flowing to the alignment marks 10A is eliminated, preventing degradation of the characteristics of the semiconductor laser chip 1E. This embodiment may be applied also to Embodiments 2 to 4. Further, since the same description with respect to the passive alignment method for Embodiment 1 suffices for this embodiment, it is omitted.

Embodiment 6

Figure 22A:
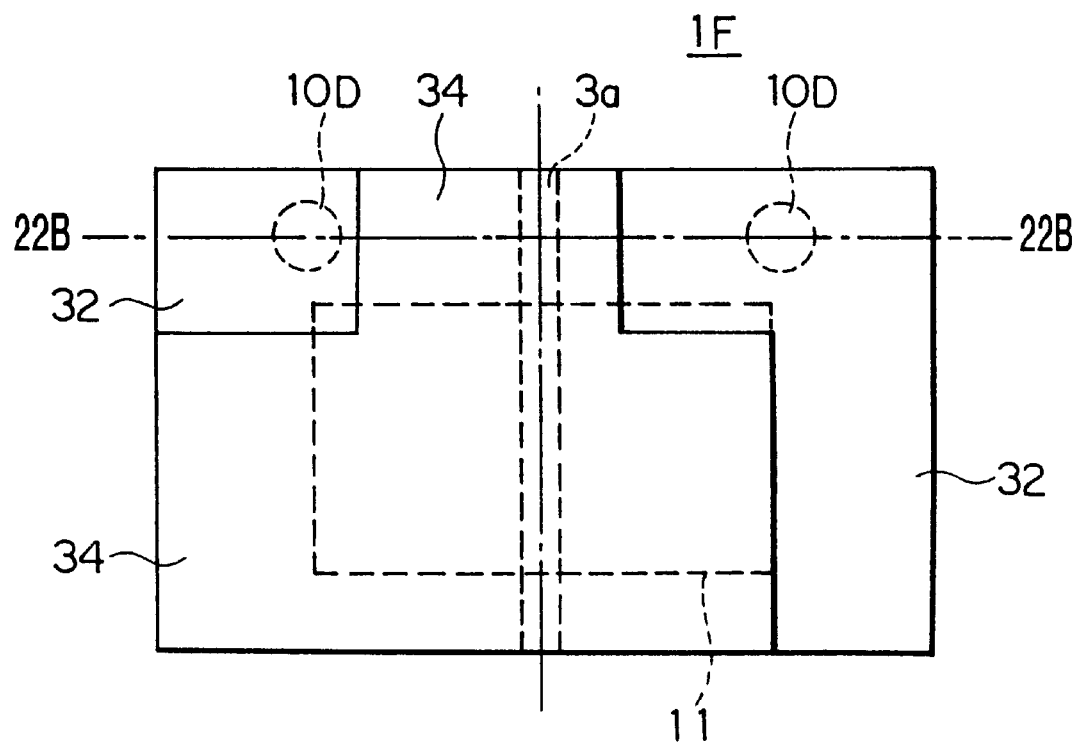
FIG. 22A is a plan view of a semiconductor laser chip according to an Embodiment 6 of the present invention.
Figure 22B:
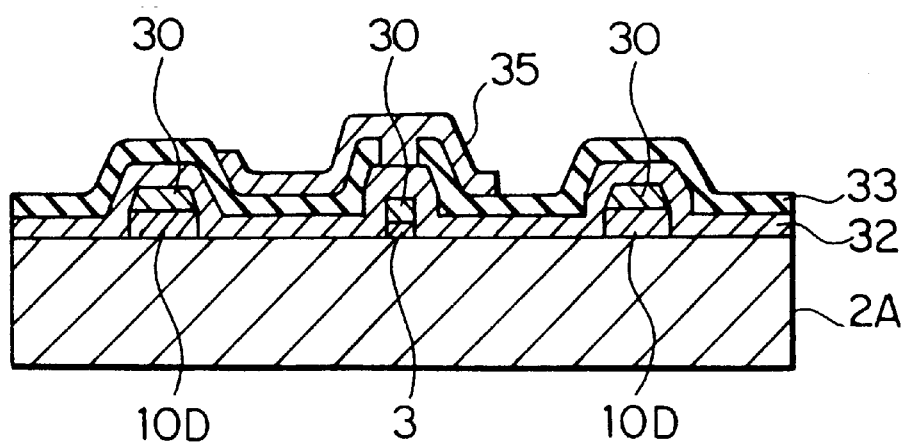
FIG. 22B is a sectional view of a semiconductor laser chip according to Embodiment 6 of the present invention.

A sixth embodiment of the present invention is described with reference to FIGS. 22A to 24B. FIG. 22A is a plan view of a semiconductor laser chip according to Embodiment 6 of the present invention; and FIG. 22B is a sectional view of the semiconductor laser chip taken along line 22B—22B of FIG. 22A. Further, FIGS. 23A to 24B are sectional views of the semiconductor laser chip according to Embodiment 6 in respective manufacturing process steps.

Referring to FIGS. 22A and 22B, a semiconductor laser chip 1F according to Embodiment 6 of the present invention includes a n-type InP substrate 2A, an InGaAsP active layer 3 (optical waveguide 3a), a p-InP first cladding layer 30, a p-InP second cladding layer 32, a current narrowing insulating film 33, a P side electrode (front surface electrode) 35, a pair of alignment marks 10D formed at the same time of the optical waveguide 3a, and a back surface electrode 11. The alignment marks 10D have a smaller bandgap energy and a greater thickness than the active layer 3. Further, the cladding layers 30 and 32 are lower in conductivity than the contact layer.

In Embodiment 4, as shown in FIG. 15A, the width of the opening of the insulating film 13 serving as a selective growth mask for forming the active layer 3 is wider than that of the final completed active layer, as shown in FIG. 17B. It has thus been necessary to narrow the active layer width to a width functioning as a single transverse mode optical waveguide through an etching process as shown FIG. 16A.

Figure 23A:
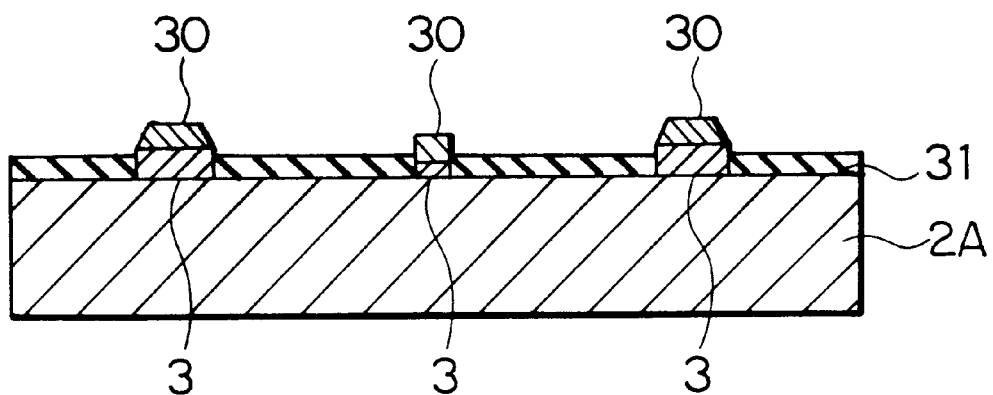
FIG. 23A is a sectional view in a process of manufacturing a semiconductor laser chip according to Embodiment 6 of the present invention.

In Embodiment 6, as shown in FIG. 23A, the opening width of the insulating film 31 serving as a selective growth mask is substantially the same width as the completed active layer. The active layer width automatically has a width for a single transverse mode optical waveguide by merely using a selective growth process to form the active layer 3, whereby the etching process as shown in FIG. 16A is unnecessary. In this case, since the insulating film 5 for the growth of a current blocking layer as shown in FIG. 16A of Embodiment 4 is not formed, a current blocking layer cannot be grown. Accordingly, the processing steps after the selective growth of the active layer 3 are as follows.

Figure 23B:
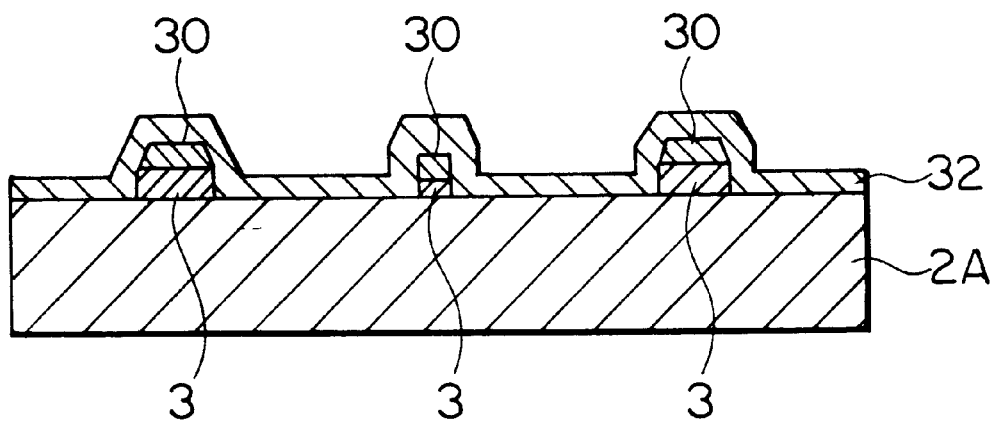
FIG. 23B is a sectional view in a process of manufacturing a semiconductor laser chip according to Embodiment 6 of the present invention.

As shown in FIG. 23A, the active layer 3 and the p-InP first cladding layer 30 are selectively grown on the n-InP substrate 2A, and the insulating film 31 used for this selective growth is removed with hydrofluoric acid or the like. As shown in FIG. 23B, after removing the insulating film 31 with hydrofluoric acid or the like, the p-InP second cladding layer 32 is grown over all the surface.

Figure 24A:
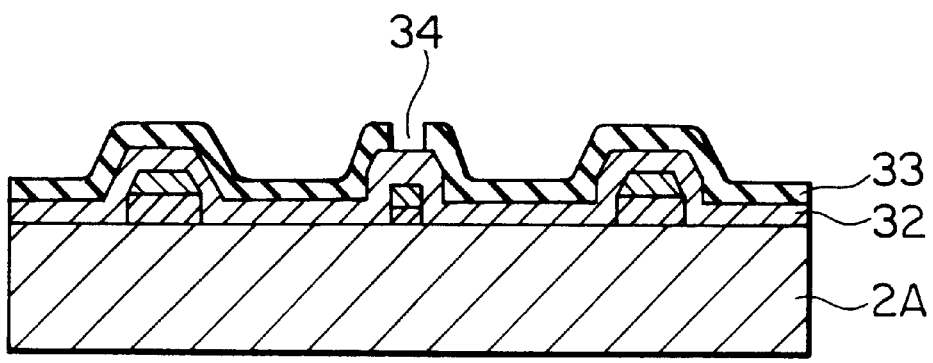
FIG. 24A is a sectional view in a process of manufacturing a semiconductor laser chip according to Embodiment 6 of the present invention.
Figure 24B:
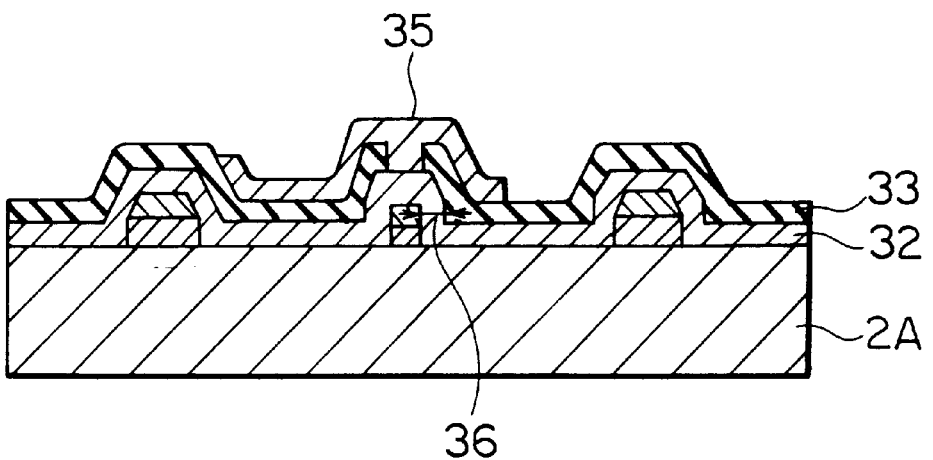
FIG. 24B is a sectional view in a process of manufacturing a semiconductor laser chip according to Embodiment 6 of the present invention.

As shown in FIG. 24A, the current narrowing insulating film 33 is formed over all the surface, and a current passage window 34 is formed only at the optical waveguide by means of a photolithographic process and etching using hydrofluoric acid or the like. Finally, as shown in FIG. 24B, the P side electrode 35 is formed on the current narrowing insulating film 33 by means of vapor deposition.

With such a construction, a current can be efficiently injected into the active layer 3 of the optical waveguide through the current narrowing insulating film 33 to cause oscillation even without a current blocking layer. Further, in this construction, if current leaks through a current leakage path 36 as shown in FIG. 24B so that a current component does not contribute to light emission, it is preferable to reduce the leakage current by using a construction where the substrate is an n-InP substrate and the upper side cladding layer is the p-InP first cladding layer 32 and p-InP second cladding layer 33 so that the current leakage path 36 is through p-type InP having a high electrical resistance.

In Embodiment 6, forming a P side contact layer is shown. It suffices to use an AuZn type P side electrode 35 in order that an ohmic contact electrode can be more readily achieved.

While in Embodiment 4 the selective growth groove 14 is first formed as shown in FIG. 15A, an example where it is not formed is Embodiment 6, since the groove is not necessarily required.

The etching process for forming an infrared absorption layer into a shape functioning as an alignment mark serves also as the etching process of the optical waveguide in FIG. 16A of Embodiment 4. Since this etching step is omitted, the forming of an alignment mark may also be completed at the same time as the optical waveguide 3. During the selective growth of the active layer 3 of FIG. 23A, the opening of the alignment mark portion is formed substantially in the shape of the final alignment mark when patterning the insulating film 31 as a mask for selective growth. With this embodiment, etching of the optical waveguide and alignment mark shown in FIG. 16A of Embodiment 4 becomes unnecessary and throughput may be increased.

Embodiment 7

While in Embodiments 1 to 6 InGaAsP is used as the alignment marks 10A to 10D, Embodiment 7 uses InGaAs as the alignment marks and InP as the crystalline material surrounding them.

Embodiment 8

While in Embodiments 1 to 6 InGaAsP is used as the alignment marks 10A to 10D, Embodiment 8 uses InGaAs as alignment marks and GaAs or AlGaAs as the crystalline material surrounding them.

Embodiment 9

While a pair of circular alignment marks are shown in the described embodiments, the shape may be a polygon, oval, cross, etc., and the number of alignment marks may be one or three or more.

Embodiment 10

Figure 25:
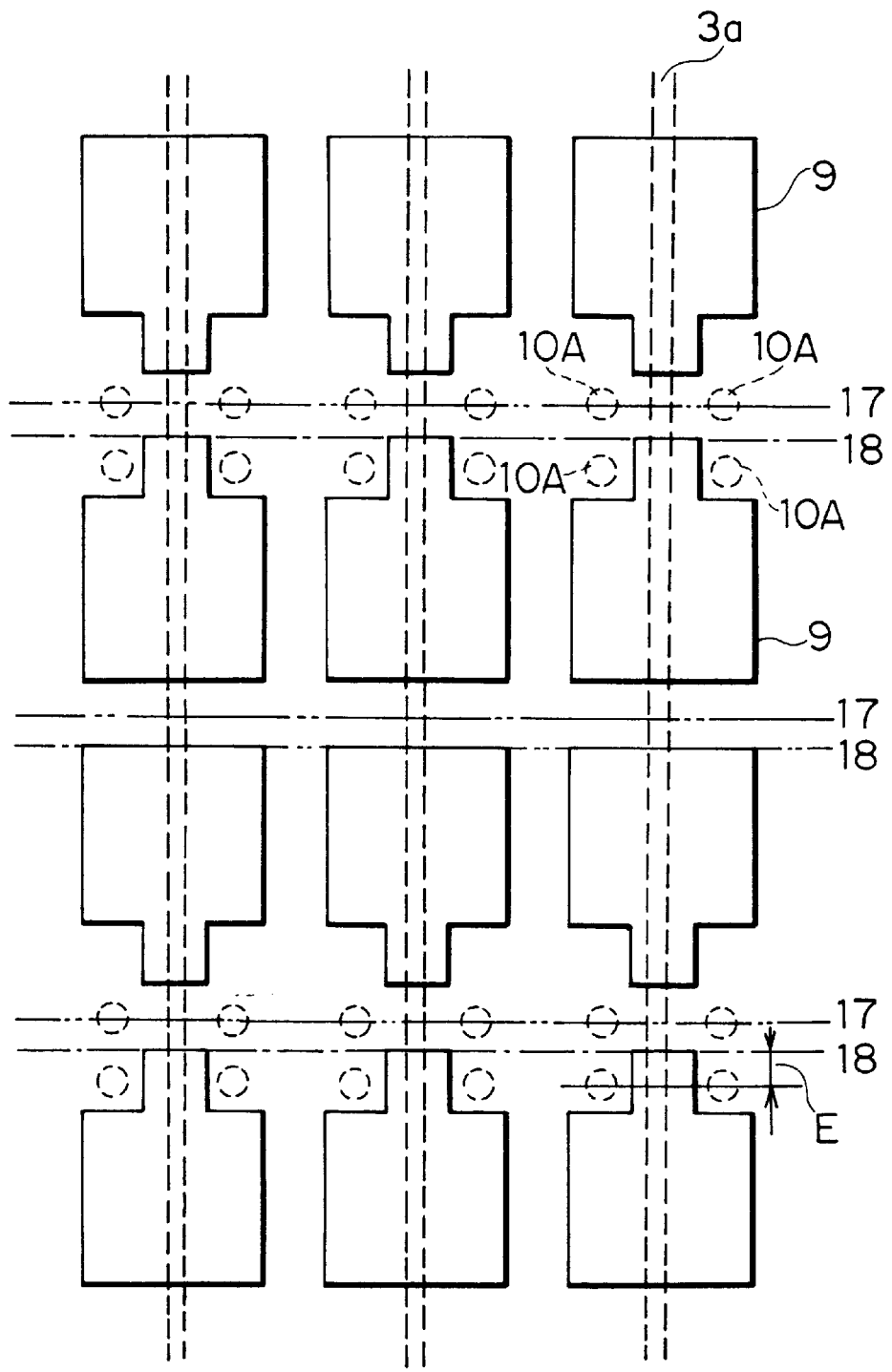
FIG. 25 shows a method of cleaving a semiconductor laser chip according to an Embodiment 9 of the present invention.
Figure 26A:
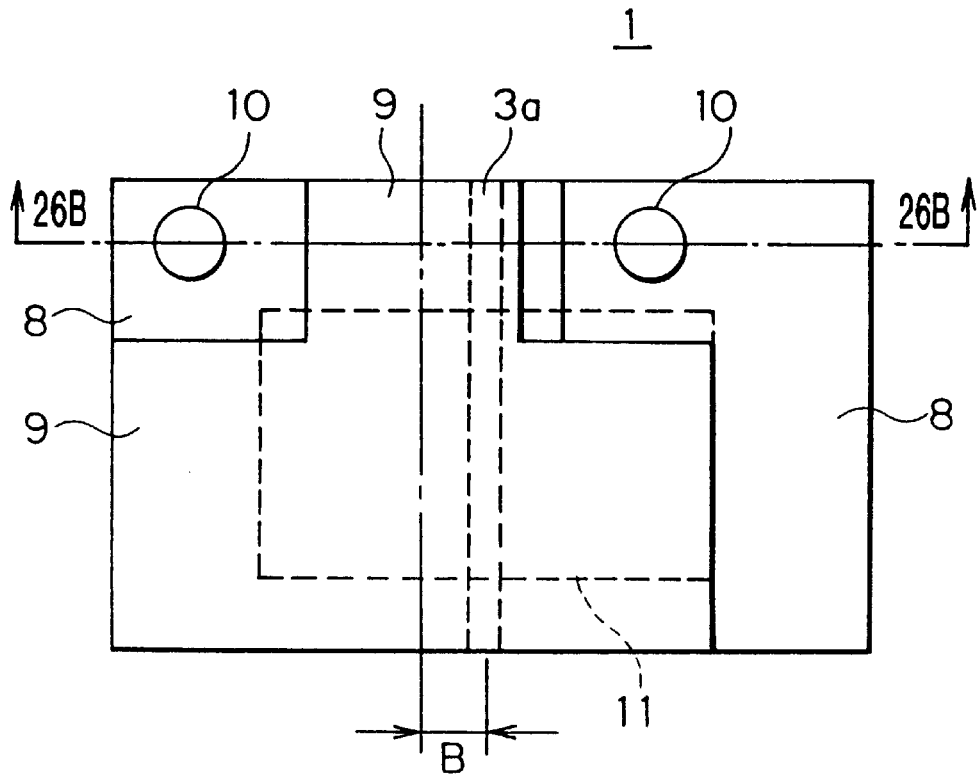
FIG. 26A is a plan view of a known semiconductor laser chip.
Figure 26B:
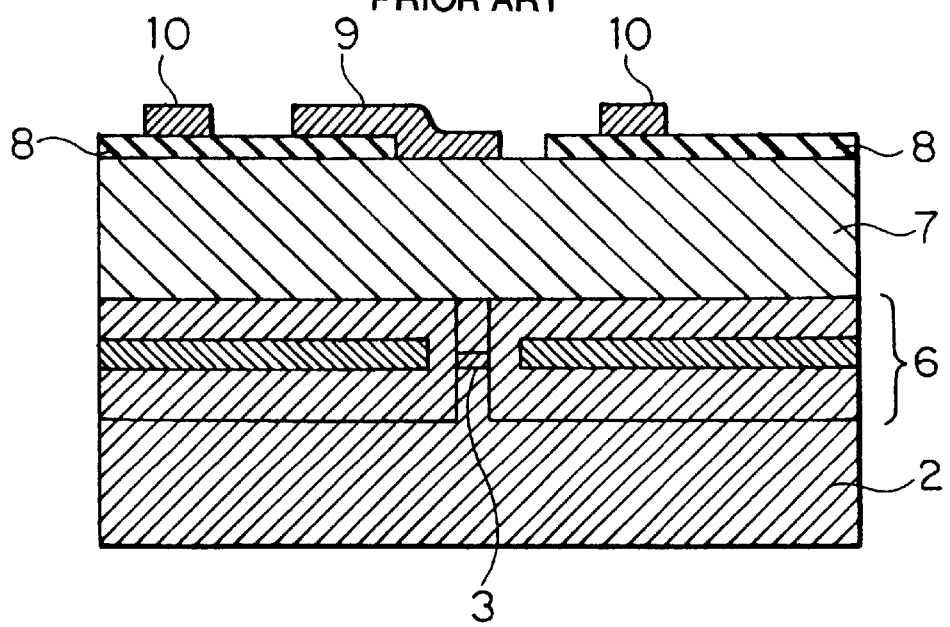
FIG. 26B is a sectional view of a known semiconductor laser chip.
Figure 27A:
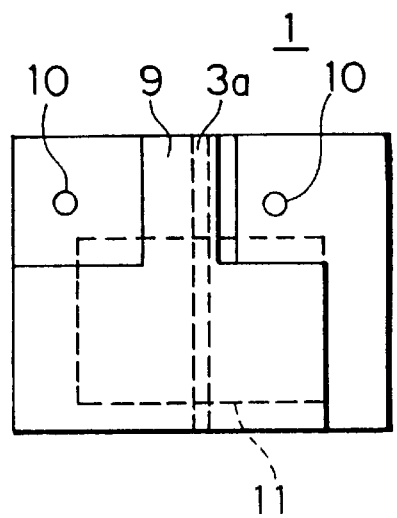
FIGS. 27A to 27C illustrate a passive alignment method using a known semiconductor laser chip.
Figure 27B:
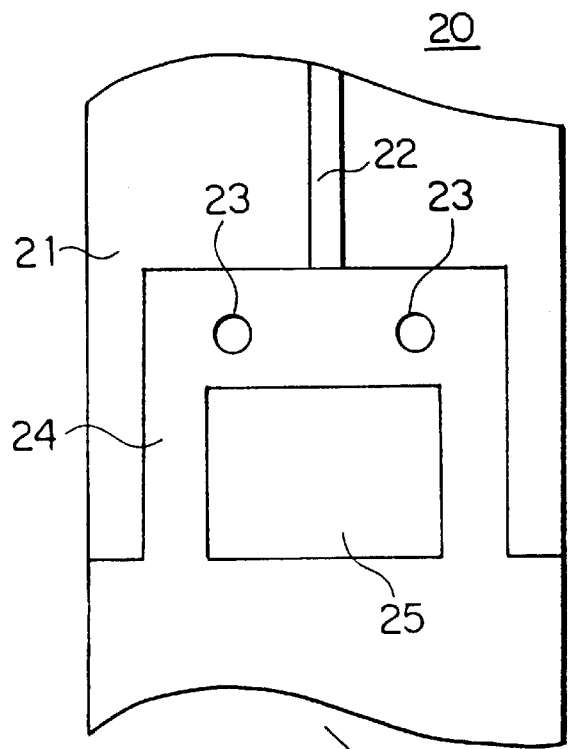
Figure 27C:
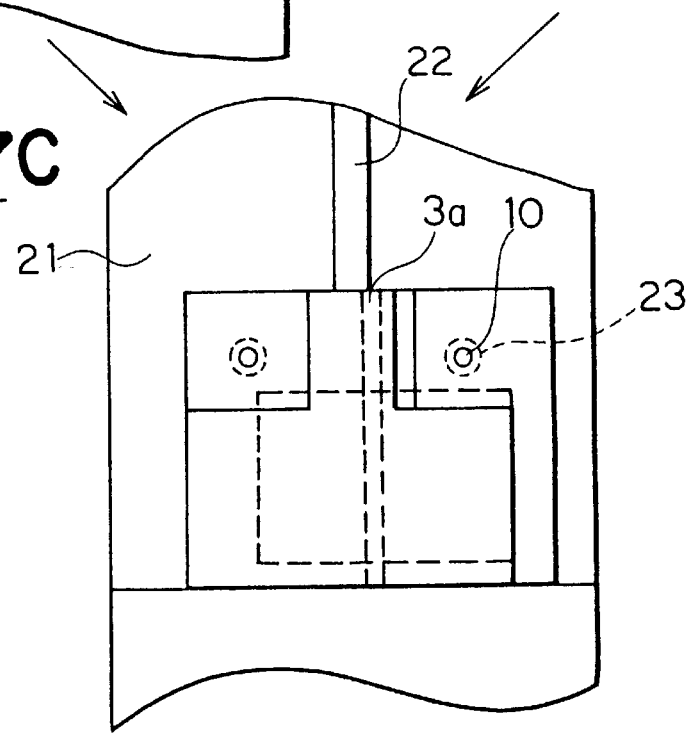

If a wafer according to the present invention is cleaved using a known cleaving method, i.e., if cleaved into bars along a center line 17 of the front surface electrodes 9 in two horizontal rows as shown in FIG. 25, the respective positions of the alignment marks with respect to the light emitting point (cleaved portion of the optical waveguide 3a) becomes uneven. Thus, in Embodiment 10, while viewing the alignment marks 10A (10B–10D) as shown in FIG. 25 with an infrared CCD camera, one cleaves semiconductor laser chips into a bar from the wafer or dices the wafer along a center line 18 between the alignment marks 10A in two horizontal rows. With the cleaving method according to Embodiment 10, it is possible to sever a semiconductor laser chip where position E of the alignment mark 10A (10B–10D) with respect to the light emitting point is uniform.

What is claimed is:

1. A method of manufacturing an optical semiconductor device comprising:

forming an optical waveguide on a substrate and forming an alignment mark on the substrate at the same time as forming said optical waveguide;

forming a conductive layer on said substrate after forming said optical waveguide and said alignment mark;

forming an insulating film on said conductive layer;

forming a front surface electrode on said insulating film; and forming a back surface electrode on a back surface of said substrate.

2. The method of manufacturing an optical semiconductor device according to claim 1, wherein forming a conductive layer comprises:

forming a current blocking layer on said substrate after forming said optical waveguide; and forming a contact layer on said optical waveguide and on said current blocking layer.

3. The method of manufacturing an optical semiconductor device according to claim 1, wherein forming a conductive layer comprises:

forming a first cladding layer on said optical waveguide and on said alignment mark; and forming a second cladding layer on said substrate.

4. The method of manufacturing an optical semiconductor device according to claim 1, wherein said optical waveguide and said alignment mark are active layers formed at the same time.

5. The method of manufacturing an optical semiconductor device according to claim 2, further comprising:

forming a first active layer on said substrate at the same time said optical waveguide is formed; and subsequently forming a second active layer serving as said alignment mark.

6. The method of manufacturing an optical semiconductor device according to claim 2, further comprising:

forming a first active layer on said substrate; and subsequently. simultaneously forming on said first active layer said optical waveguide and a second active layer serving as said alignment mark.

7. The method of manufacturing an optical semiconductor device according to claim 2, wherein said optical waveguide and said alignment mark are active layers, and wherein said alignment mark is thicker than said optical waveguide, said optical waveguide and alignment mark being formed at the same time.

8. The method of manufacturing an optical semiconductor device according to claim 2, wherein said optical waveguide and said alignment mark are active layers formed at the same time, the method further comprising forming an electrical separation groove between said optical waveguide and said alignment mark.

9. The method of manufacturing an optical semiconductor device according to claim 2, further comprising cleaving a wafer based on said alignment mark.

* * * * *